United States Patent
Arai et al.

(10) Patent No.: US 10,290,734 B2
(45) Date of Patent: May 14, 2019

(54) MOSFET AND POWER CONVERSION CIRCUIT

(71) Applicant: SHINDENGEN ELECTRIC MANUFACTURING CO., LTD., Chiyoda-ku, Tokyo (JP)

(72) Inventors: Daisuke Arai, Saitama (JP); Mizue Kitada, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 15/765,633

(22) PCT Filed: Mar. 17, 2017

(86) PCT No.: PCT/JP2017/011066
§ 371 (c)(1),
(2) Date: Apr. 3, 2018

(87) PCT Pub. No.: WO2018/087943
PCT Pub. Date: May 17, 2018

(65) Prior Publication Data
US 2019/0081172 A1    Mar. 14, 2019

(30) Foreign Application Priority Data
Nov. 11, 2016 (WO) ................. PCT/JP2016/083604

(51) Int. Cl.
*H01L 29/78* (2006.01)
*H01L 29/08* (2006.01)
(Continued)

(52) U.S. Cl.
CPC ...... *H01L 29/7813* (2013.01); *H01L 29/0856* (2013.01); *H01L 29/0873* (2013.01);
(Continued)

(58) Field of Classification Search
CPC .................. H01L 29/7813; H01L 29/7812
See application file for complete search history.

(56) References Cited

U.S. PATENT DOCUMENTS

2006/0151806 A1   7/2006  Fukuda et al.
2007/0013000 A1   1/2007  Shiraishi
(Continued)

FOREIGN PATENT DOCUMENTS

JP    2004-119611 A    4/2004
JP    2010-171221 A    8/2010
(Continued)

OTHER PUBLICATIONS

International Search Report in PCT/JP2017/011066, dated Jun. 6, 2017, 3pp.
(Continued)

*Primary Examiner* — Moazzam Hossain
*Assistant Examiner* — Hajar Kolahdouzan
(74) *Attorney, Agent, or Firm* — Hauptman Ham, LLP

(57) ABSTRACT

A MOSFET includes: a semiconductor base substrate having a super junction structure; and a gate electrode formed on a first main surface side of the semiconductor base substrate by way of a gate insulation film. In a graph where a depth x at a predetermined depth position in the super junction structure is taken on an axis of abscissas, and an average positive charge density $\rho(x)$ at the predetermined depth position in the super junction structure is taken on an axis of ordinates, the average positive charge density $\rho(x)$ at a predetermined depth position of the super junction structure when the super junction structure is depleted by turning off the MOSFET is expressed by an upward convex curve projecting in a right upward direction.

11 Claims, 12 Drawing Sheets

(51) Int. Cl.
*H02M 3/155* (2006.01)
*H01L 29/872* (2006.01)
(52) U.S. Cl.
CPC ........ *H01L 29/7812* (2013.01); *H02M 3/155* (2013.01); *H01L 29/872* (2013.01)

(56) References Cited

U.S. PATENT DOCUMENTS

| | | |
|---|---|---|
| 2010/0025760 A1 | 2/2010 | Kawashima |
| 2010/0187604 A1 | 7/2010 | Ono et al. |
| 2012/0139512 A1 | 6/2012 | Usui |
| 2013/0087851 A1 | 4/2013 | Kagata et al. |

FOREIGN PATENT DOCUMENTS

| | | | | |
|---|---|---|---|---|
| JP | 2012-120362 A | | 6/2012 | |
| JP | 2012-234848 A | | 11/2012 | |
| JP | 2013-93560 A | | 5/2013 | |
| JP | 2013093560 A | * | 5/2013 | ......... H01L 29/7827 |
| JP | 2015-80321 A | | 4/2015 | |

OTHER PUBLICATIONS

International Search Report in PCT/JP2016/083604, dated Jan. 24, 2017, 4pp.
Office Action in NL Application No. 2019845, dated Aug. 7, 2018, 12pp.

* cited by examiner

MOSFET AND POWER CONVERSION CIRCUIT

RELATED APPLICATIONS

The present application is a National Phase of International Application Number PCT/JP2017/011066, filed Mar. 17, 2017, which claims priority to International Application Number PCT/JP2016/083604, filed Nov. 11, 2016.

TECHNICAL FIELD

The present invention relates to a Metal-Oxide Semiconductor Field-Effect Transistor (MOSFET) and a power conversion circuit.

BACKGROUND ART

Conventionally, there has been known a MOSFET which includes a semiconductor base substrate having a super junction structure which is formed of an n-type column region and a p-type column region (see patent document 1, for example).

In this specification, "super junction structure" means a structure where an n-type column region and a p-type column region are alternately and repeatedly arranged as viewed in a predetermined cross section.

As shown in FIG. 17, a conventional MOSFET 900 is a planar-gate-type MOSFET which includes: a semiconductor base substrate 910 having a super junction structure 917 formed of an n-type column region 914 and a p-type column region 916, a base region 918 formed on a surface of a first main surface and a whole surface of the p-type column region 916 and a part of a surface of the n-type column region 914, an n-type surface high concentration region 919 formed on the surface of the first main surface and the surface of the n-type column region 914 such that the n-type surface high concentration region 919 is disposed adjacently to the base region 918, and an n-type source region 920 formed on a surface of the base region 918; and a gate electrode 936 formed on the surface of the base region 918 sandwiched between the source region 920 and the n-type surface high concentration region 919 by way of a gate insulation film 93.

In the conventional MOSFET 900, the n-type column region 914 and the p-type column region 916 are formed such that a total amount of a dopant in the n-type column region 914 is equal to a total amount of a dopant in the p-type column region 916. That is, the n-type column region 914 and the p-type column region 916 are well-balanced with each other in terms of a charge. Both dopant concentration in the n-type column region 914 and dopant concentration in the p-type column region 916 are set to a fixed value regardless of a depth of the n-type column region 914 and a depth of the p-type column region 916. Further, side walls of the n-type column region 914 are formed in a tapered shape narrowed toward a first main surface side, and side walls of the p-type column region 916 are formed in a tapered shape with a narrow bottom.

In the specification, "total amount of a dopant" means a total amount of a dopant in a constitutional element (the n-type column region or the p-type column region) in the MOSFET.

According to the conventional MOSFET 900, the MOSFET includes the semiconductor base substrate 910 having the super junction structure 917 which is formed of the n-type column region 914 and the p-type column region 916 and hence, it is possible to provide a switching element having a low ON resistance and a high withstand voltage.

PRIOR ART DOCUMENT

Patent Document

Patent document 1: JP-A-2004-119611
Patent document 2: JP-A-2013-93560

SUMMARY OF INVENTION

Problem to be Solved by the Invention

In the conventional MOSFET 900, there exists a drawback that when there is an irregularity in a charge balance around a gate, an irregularity in switching characteristics when the MOSFET is turned off becomes large.

Accordingly, the present invention has been made so as to overcome the above-mentioned drawback, and it is an object of the present invention to provide a MOSFET and a power conversion circuit which uses the MOSFET where an irregularity in switching characteristics when the MOSFET is turned off can be decreased compared to a prior art even when an irregularity in a charge balance occurs around the gate.

Solution to Problem

[1] According to the present invention, there is provided a MOSFET which includes: a semiconductor base substrate having the super junction structure which is formed of an n-type column region and a p-type column region; and a gate electrode formed on a first main surface side of the semiconductor base substrate by way of a gate insulation film, wherein using a deepest position of a surface of a depletion layer on the first main surface side when the depletion layer extends most in the super junction structure by turning off the MOSFET as a reference, in a graph where a depth x at a predetermined depth position in the super junction structure when the super junction structure is depleted by turning off the MOSFET is taken on an axis of abscissas, and an average positive charge density $\rho(x)$ at the predetermined depth position in the super junction structure expressed by a following formula (1) when the super junction structure is depleted by turning off the MOSFET is taken on an axis of ordinates, the average positive charge density $\rho(x)$ is expressed by an upward convex curve projecting in a right upward direction, and using a deepest position of a surface of a depletion layer on the first main surface side when the depletion layer extends most in the super junction structure by turning off the MOSFET as a reference, assuming a depth of a surface of the depletion layer on a second main surface side at a shallowest position when the depletion layer extends most in the super junction structure by turning off the MOSFET as a, a value of the average positive charge density $\rho(0)$ when x=0 becomes a negative value and a value of the average positive charge density $\rho(a)$ when x=a becomes a positive value, and an area of a region surrounded by a curve which expresses the average positive charge density $\rho(x)$, a straight line where x=0 and the axis of abscissas is equal to an area of a region surrounded by the curve which expresses the average positive charge density ρ(x), a straight line where x=a and the axis of abscissas.

[Formula 1]

$$\rho(x) = \frac{q}{2w}[w_n(x) \cdot N_d(x) - w_p(x) \cdot N_a(x)] \quad (1)$$

(In the formula (1), $w_n(x)$ indicates a width of the n-type column region at the predetermined depth position, $N_d(x)$ indicates average density of a positive charge at the predetermined depth position in the n-type column region when the super junction structure is depleted by turning off the MOSFET, $w_p(x)$ indicates a width of the p-type column region at the predetermined depth position, $N_a(x)$ indicates average density of a negative charge at the predetermined depth position in the p-type column region when the super junction structure is depleted by turning off the MOSFET, q indicates an elementary charge, and w indicates a positive constant which satisfies $w_n(x)+w_p(x)=2w$.)

In this specification, "a depth at a predetermined depth position in the super junction structure" means a depth at a predetermined depth position in the super junction structure using a deepest position of a surface of a depletion layer on the first main surface side when the depletion layer extends most in the super junction structure by turning off the MOSFET as a reference. Accordingly, the depth x becomes 0 at the deepest position of the surface of the depletion layer on the first main surface side when the depletion layer extends most in the super junction structure by turning off the MOSFET. "second main surface" means a main surface on a side opposite to the first main surface. "average density of a positive charge at the predetermined depth position in the n-type column region" means average density of a positive charge generated by a donor in the n-type column region when the n-type column region is depleted by turning off the MOSFET, and "average density of a negative charge at the predetermined depth position in the p-type column region" means average density of a negative charge generated in an acceptor of the p-type column region when the p-type column region is depleted by turning off the MOSFET. Further, "average positive charge density ρ(x) at a predetermined depth position of the super junction structure is expressed by an upward convex curve projecting in a right upward direction" means not only the case where the average positive charge density is expressed by a monotonous upward convex curve projecting in a right upward direction but also a case where the average positive charge density is expressed in a stepped shape (a line (an envelope) which connects corner portions of steps forming a monotonous upward convex curve projecting in a right upward direction), and a case where the average positive charge density is formed of a curve where a concave shape and a convex shape are repeated (an envelope forming a monotonous upward convex curve projecting in a right upward direction).

[2] According to the MOSFET of the present invention, it is preferable that using a deepest position of a surface of a depletion layer on the first main surface side when the depletion layer extends most in the super junction structure by turning off the MOSFET as a reference, assuming a depth of a surface of the depletion layer on the second main surface side at a shallowest position when the depletion layer extends most in the super junction structure by turning off the MOSFET as a, and a depth of a depth position where the average positive charge density ρ(x) becomes 0 in the super junction structure as d, a relationship of 0<d<a/2 be satisfied.

[3] According to the MOSFET of the present invention, it is preferable that in a graph where the depth x at the predetermined depth position in the super junction structure is taken on an axis of abscissas, and a width $w_n(x)$ at the predetermined depth position in the n-type column region or a width $w_p(x)$ at the predetermined depth position in the p-type column region is taken on an axis of ordinates, the width $w_n(x)$ at the predetermined depth position in the n-type column region be expressed by an upward convex curve projecting in a right upward direction, and the width $w_p(x)$ at the predetermined depth position in the p-type column region be expressed by a downward convex curve projecting in a right downward direction.

[4] According to the MOSFET of the present invention, it is preferable that in a graph where the depth x at the predetermined depth position in the super junction structure is taken on an axis of abscissas, and average density $N_d(x)$ of a positive charge at the predetermined depth position in the n-type column region or average density $N_a(x)$ of a negative charge at the predetermined depth position in the p-type column region when the super junction structure is depleted by turning off the MOSFET is taken on an axis of ordinates, average density $N_d(x)$ of a positive charge at the predetermined depth position in the n-type column region when the super junction structure is depleted by turning off the MOSFET be expressed by an upward convex curve projecting in a right upward direction, and average density $N_a(x)$ of a negative charge at the predetermined depth position in the p-type column region when the super junction structure is depleted by turning off the MOSFET be expressed by a downward convex curve projecting in a right downward direction.

[5] According to the MOSFET of the present invention, it is preferable that the semiconductor base substrate further have a p-type base region formed on a surface of the n-type column region and a surface of the p-type column region, and an n-type source region formed on a surface of the base region, the MOSFET further include, in a region where the n-type column region is positioned as viewed in a plan view, a trench formed so as to extend from a surface of a first main surface of the semiconductor base substrate to a depth position deeper than a deepest portion of the base region and a portion of the source region be exposed on an inner peripheral surface of the trench, the gate insulation film be formed on the inner peripheral surface of the trench, and the gate electrode be embedded in the trench by way of the gate insulation film.

[6] According to the MOSFET of the present invention, it is preferable that the semiconductor base substrate further have: a base region formed on a surface of the first main surface of the semiconductor base substrate, a whole surface of the p-type column region, and a portion of a surface of the n-type column region; an n-type surface high concentration region formed on a surface of the first main surface of the semiconductor base substrate and a surface of the n-type column region such that the n-type surface high concentration region is formed adjacently to the base region; and an n-type source region formed on a surface of the base region, and the gate electrode be formed on a surface of the base region sandwiched between the source region and the n-type surface high concentration region by way of the gate insulation film.

[7] According to the MOSFET of the present invention, it is preferable that using a deepest position of a surface of a depletion layer on the first main surface side when the depletion layer extends most in the super junction structure by turning off the MOSFET as a reference, in a graph where an axis along a depth direction is set as an x axis, an x coordinate at a depth position of a lowermost surface of the base region is set as $-t$, an x coordinate at depth position of a lowermost portion of the p-type column region is set as b, and an x coordinate at a depth position where the average positive charge density $\rho(x)$ becomes 0 is set as d, a relationship of $0<t+d<(t+b)/2$ be satisfied.

[8] According to the present invention, there is provided a power conversion circuit which includes at least: a reactor; a power source which supplies an electric current to the reactor; the MOSFET according to any one of [1] to [7] for controlling an electric current supplied from the power source to the reactor; and a rectifier element which performs a rectifying operation of the electric current supplied from the power source to the reactor or an electric current from the reactor.

[9] According to the power conversion circuit of the present invention, it is preferable that the rectifier element be a fast recovery diode.

[10] According to the power conversion circuit of the present invention, it is preferable that the rectifier element be a built-in diode of the MOSFET.

[11] According to the power conversion circuit of the present invention, it is preferable that the rectifier element be a silicon-carbide Schottky barrier diode.

Advantageous Effects of the Present Invention

According to the MOSFET and the power conversion circuit of the present invention, average positive charge density $\rho(x)$ at a predetermined depth position of the super junction structure when the super junction structure is depleted by turning off the MOSFET is expressed by an upward convex curve projecting in a right upward direction. With such a configuration, in a depth position around the gate (a region where x is close to 0), the average positive charge density $\rho(x)$ becomes smaller than (larger on a negative side) a conventional MOSFET 900, and the difference between a charge amount of a negative charge in the p-type column region and a charge amount of a positive charge in the n-type column region becomes large compared to the conventional MOSFET 900. Accordingly, the following advantages can be acquired.

(1) The n-type column region around the gate becomes easily depleted compared to the conventional MOSFET 900 and hence, even when a drain voltage is increased, a potential of the n-type column region around the gate is minimally increased.

(2) A distance between a non-depleted region in the n-type column region and the gate electrode becomes long compared to the conventional MOSFET 900 and hence, a feedback capacitance Crss (equal to a gate-drain capacitance Cgd) becomes small compared to the conventional MOSFET 900. Accordingly, even when a potential of the n-type column region (the non-depleted region of the n-type column region) is increased along with the increase of a drain voltage which takes place when the MOSFET is turned off, the gate electrode is minimally affected by a change in potential of the n-type column region. As a result, even when an irregularity exists in a charge balance around the gate, an irregularity in switching characteristics when the MOSFET is turned off can be reduced compared to the prior art.

Further, according to the MOSFET of the present invention, average positive charge density $\rho(x)$ at a predetermined depth position of the super junction structure when the super junction structure is depleted by turning off the MOSFET is expressed as an upward convex curve projecting in a right upward direction. With such a configuration, at a depth position around the gate, an average positive charge density $\rho(x)$ becomes small (large on a negative side) and hence, a charge amount of a negative charge in the p-type column region becomes larger than a charge amount of a positive charge in the n-type column region. Accordingly, holes around the gate in the p-type column region can be easily extracted by a negative charge in the p-type column region. As a result, an L-load avalanche breakdown resistance can be increased compared to a prior art.

Further, the MOSFET according to the present invention includes the semiconductor base substrate where the super junction structure is formed of the n-type column region and the p-type column region. Accordingly, in the same manner as the conventional MOSFET 900, the MOSFET becomes a switching element having a low ON resistance and a high withstand voltage.

In the MOSFET according to the present invention, the average positive charge density $\rho(0)$ when $x=0$ takes a negative value, and the average positive charge density $\rho(a)$ when $x=a$ takes a positive value. Accordingly, at a depth position in the vicinity of a bottom portion of the p-type column region, a total amount of a dopant in the p-type column region becomes smaller than a total amount of a dopant in the n-type column region (becoming n-type dopant rich). With such a configuration, a depletion layer generated from the p-type column region when the MOSFET is turned off minimally extends toward a second main surface side. Accordingly, it is possible to provide an MOSFET where a breakdown in a reach through mode minimally occurs so that a withstand voltage is minimally lowered.

Patent document 2 discloses a MOSFET 902 where a width of the p-type column region 816 is increased from a center portion to a bottom portion of the p-type column region 816 in a depth direction (see FIG. 18). However, an average positive charge density $\rho(x)$ of a MOSFET 902 according to patent document 2 is expressed by a downward convex curve projecting in a right upward direction. Accordingly, the MOSFET 902 according to patent document 2 differs from the MOSFET of the present invention where average positive charge density $\rho(x)$ is expressed by an upward convex curve projecting in a right upward direction.

BRIEF DESCRIPTION OF DRAWINGS

In FIG. 3, the illustration of constitutional elements other than the super junction structure 117 (an n-type column region 114 and a p-type column region 116), and a buffer layer 113 are omitted. In FIG. 3, an x axis on a left side is an axis taken along a depth direction using a deepest position of a surface of a depletion layer on a first main surface side when the depletion layer extends most in the super junction structure by turning off the MOSFET as a reference. A position −t on the x coordinate indicates a depth position of a lowermost surface of a base region 118, a position b on the x coordinate indicates a depth position of a lowermost portion of a p-type column region 116, and a position a on the x coordinate is a shallowest position of a surface of a depletion layer on a second main surface side when the depletion layer extends most in the super junction structure by turning off the MOSFET (the same definition applicable to FIG. 4A to FIG. 4D and FIG. 5A to FIG. 5D).

FIG. 4A is a graph expressing a change in the width $w_n(x)$ at the predetermined depth position of the n-type column region and the width $w_p(x)$ at the predetermined depth position of the p-type column region with respect to the depth, FIG. 4B is a graph expressing a change in average density $N_d(x)$ of a positive charge at the predetermined depth position of the n-type column region and average density $N_a(x)$ of a negative charge at the predetermined depth position of the p-type column region with respect to the depth, FIG. 4C is a graph expressing a change in average positive charge density $\rho(x)$ at the predetermined depth position of the super junction structure with respect to the depth x, and FIG. 4D is a graph expressing a change in an electric field $E(x)$ at the predetermined depth position of the super junction structure with respect to the depth x. On the x coordinate, the position d is the depth position where the average positive charge density $\rho(x)$ becomes 0.

FIG. 5A is a graph expressing a change in the width $w_n(x)$ at the predetermined depth position of the n-type column region 114 and the width $w_p(x)$ at the predetermined depth position of the p-type column region 116 with respect to the depth x, FIG. 5B is a graph expressing a change in average density $N_d(x)$ of a positive charge at the predetermined depth position of the n-type column region 114 and average density $N_a(x)$ of a negative charge at the predetermined depth position of the p-type column region 116 with respect to the depth x, FIG. 5C is a graph expressing a change in average positive charge density $\rho(x)$ at the predetermined depth position of the super junction structure 117 with respect to the depth x, and FIG. 5D is a graph expressing a change in an electric field $E(x)$ at the predetermined depth position of the super junction structure 117 with respect to the depth x.

In FIG. 6, "p-type dopant rich" means a case where a total amount of a dopant in a p-type column region is 10% larger than a total amount of a dopant in an n-type column region, "n-type dopant rich" means a case where a total amount of a dopant in a n-type column region is 10% larger than a total amount of a dopant in a p-type column region, and "Just" means a case where a total amount of a dopant in a n-type column region and a total amount of a dopant in an p-type column region are equal (the same definition applicable to FIG. 7). Further, a power source voltage is 300V (the same definition applicable to FIG. 7).

In FIG. 8, the illustration of a source region is omitted (the same definition applicable to FIG. 9).

FIG. 9 shows a mode of a depletion layer at the same timing as FIG. 8.

FIG. 10A is a cross-sectional view showing the MOSFET 700 according to Comparative example 2. FIG. 10B is a cross-sectional view showing the MOSFET 100A according to the present invention example. FIG. 10A and FIG. 10B are schematic views and do not strictly reflect sizes and shapes of the structures used in a simulation result shown in FIG. 6.

FIG. 11A is a view showing the simulation result of equal potential lines when the MOSFET is turned off in the MOSFET 700 according to the Comparative example 2. FIG. 11B is a view showing the simulation result of equal potential lines when the MOSFET is turned off in the MOSFET 100A according to the present invention example. FIG. 11A is a view corresponding to a region surrounded by a chain line shown in FIG. 10A, and FIG. 11B is a view corresponding to a region surrounded by a chain line shown in FIG. 10B. In FIG. 11A and FIG. 11B, a bold black solid line indicates a boundary between an n-type column region and an p-type column region, a black fine solid line indicates equal potential lines drawn at an interval of 3V, and a white solid line indicates a boundary between a region where carriers become 5% at a normal time and remaining other regions.

FIG. 12A is a cross-sectional view showing the MOSFET 102 according to Embodiment 2, FIG. 12B is a graph expressing changes when a super junction structure 117 is depleted by turning off the MOSFET, that is, a change in width $w_n(x)$ at a predetermined depth position of an n-type column region 114 with respect to a depth x, a change in a width $w_p(x)$ at a predetermined depth position in a p-type column region 116 with respect to the depth x, and FIG. 12C is a graph expressing changes when a super junction structure 117 is depleted by turning off the MOSFET, that is, a change in average density $N_d(x)$ of a positive charge at a predetermined depth position of the n-type column region with respect to the depth x, a change in average density $N_a(x)$ of a negative charge at a predetermined depth position of the p-type column region with respect to the depth x.

DESCRIPTION OF EMBODIMENTS

Figure 1:
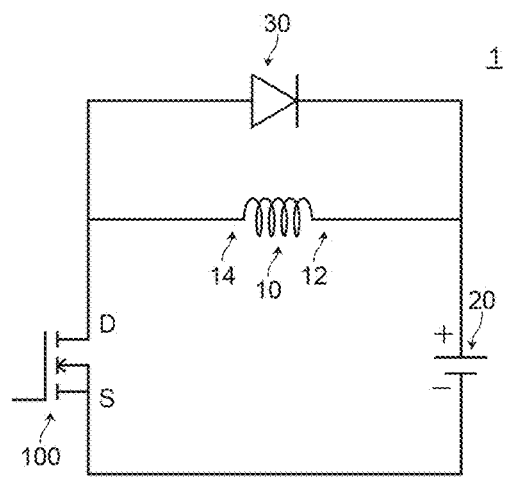
FIG. 1 is a circuit diagram showing a power conversion circuit 1 according to Embodiment 1.

Hereinafter, a MOSFET and a power conversion circuit according to the present invention are described in accordance with Embodiments shown in the drawings. The respective drawings are schematic drawings, and do not always strictly reflect actual sizes of the MOSFET and the power conversion circuit.

Embodiment 1

1. Structure and Operation of Power Conversion Circuit 1 According to Embodiment 1

A power conversion circuit 1 according to Embodiment 1 is a chopper circuit which is a constitutional element such as a DC-DC converter or an inverter. The power conversion circuit 1 according to Embodiment 1 includes, as shown in FIG. 1, a reactor 10, a power source 20, a MOSFET 100 according to Embodiment 1, and a rectifier element 30.

The reactor 10 is a passive element which can store energy in a magnetic field generated by an electric current which flows through the reactor 10.

The power source 20 is a DC power source which supplies an electric current to the reactor 10. The MOSFET 100 controls an electric current supplied from the power source 20 to the reactor 10. To be more specific, the MOSFET 100 is switched to assume an ON state in response to a clock signal applied from a drive circuit (not shown in the drawing) to a gate electrode of the MOSFET 100, and makes the reactor 10 and a negative pole of the power source 20 electrically conductive with each other. The specific structure of the MOSFET 100 is described later.

The rectifier element 30 is a fast recovery diode which performs a rectifying operation of an electric current supplied from the power source 20 to the reactor 10. To be more specific, the rectifier element 30 is a lifetime-controlled PIN diode.

A positive pole (+) of the power source 20 is electrically connected to one end 12 of the reactor 10 and a cathode electrode of the rectifier element 30, and a negative pole (−) of the power source 20 is electrically connected to a source electrode of the MOSFET 100. A drain electrode of the MOSFET 100 is electrically connected to the other end 14 of the reactor 10 and an anode electrode of the rectifier element 30.

In such a power conversion circuit 1, when the MOSFET 100 is in an ON state, an electric current path from a positive pole (+) of the power source 20 to the negative pole (−) of the power source 20 through the reactor 10 and the MOSFET 100 is formed, and an electric current flows through the electric current path. In this case, electric energy of the power source 20 is stored in the reactor 10.

When the MOSFET 100 is turned off, an electric current which flows through the electric current path from the positive pole (+) of the power source 20 to the negative pole (−) of the power source 20 through the reactor 10 and the MOSFET 100 is decreased and becomes 0 soon. On the other hand, the reactor 10 generates an electromotive force in a direction in which a change in an electric current is obstructed (electric energy stored in the reactor 10 is discharged) due to a self induction effect. An electric current generated due to an electromotive force of the reactor 10 flows to the rectifier element 30, and a forward electric current flows in the rectifier element 30.

A sum of an amount of an electric current which flows through the MOSFET 100 and an amount of an electric current which flows through the rectifier element 30 is equal to an amount of an electric current which flows through the reactor 10. A switching period of the MOSFET 100 is short (possibly 100 nsec at maximum) and hence, an amount of an electric current which flows through the reactor 10 minimally changes during such a period. Accordingly, a sum of an amount of an electric current which flows through the MOSFET 100 and an amount of an electric current which flows through the rectifier element 30 minimally changes in either case, that is, an ON state, a turn-off period or an OFF state.

In such a power conversion circuit 1, a case is considered where a MOSFET where side walls of the n-type column region 914 are formed in a tapered shape narrowed toward a first main surface side, and side walls of the p-type column region 916 are formed in a tapered shape with a narrow bottom (for example, a conventional MOSFET 900) is used as the MOSFET. In this case, when an irregularity exists in a charge balance around the gate, there arises a drawback that an irregularity in switching characteristics when the power conversion circuit 1 is turned off is increased (see FIG. 6 described later).

Accordingly, in the present invention, as the MOSFET, the MOSFET 100 according to Embodiment 1 having the following structure is used.

2. Structure of MOSFET 100 According to Embodiment 1

Figure 2:
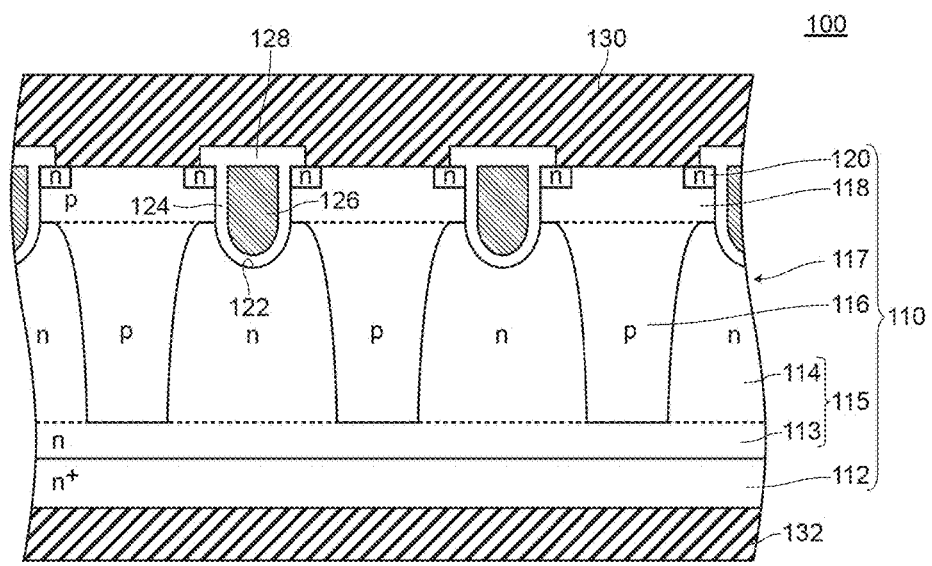
FIG. 2 is a cross-sectional view of a MOSFET 100 according to Embodiment 1.

As shown in FIG. 2, the MOSFET 100 according to Embodiment 1 is a trench-gate-type MOSFET which includes a semiconductor base substrate 110, a trench 122, a gate electrode 126, an interlayer insulation film 128, a source electrode 130, and a drain electrode 132. A drain-source withstand voltage of the MOSFET 100 is 300V or more, for example, 600V.

The semiconductor base substrate 110 has an n-type low-resistance semiconductor layer 112, an n-type buffer layer 113 formed on the low-resistance semiconductor layer 112 and having a lower dopant concentration than dopant concentration in the low-resistance semiconductor layer 112, a super junction structure 117 formed of n-type column regions 114 and p-type column regions 116 which are formed on the buffer layer 113 where the n-type column region 114 and the p-type column region 116 are alternately arranged along a horizontal direction, a p-type base region 118 formed on surfaces of the n-type column regions 114 and surfaces of the p-type column regions 116, and n-type source regions 120 formed on a surface of the base region 118. The buffer layer 113 and the n-type column regions 114 are integrally formed with each other, and the buffer layer 113 and the n-type column regions 114 form an n-type semiconductor layer 115.

Although a total amount of a dopant in the n-type column region 114 is set equal to a total amount of a dopant in the p-type column region 116, a total amount of a dopant in the n-type column region 114 may be set larger than a total amount of a dopant in the p-type column region 116 or a total amount of a dopant in the n-type column region 114 may be set smaller than a total amount of a dopant in the p-type column region 116.

Figure 5A:
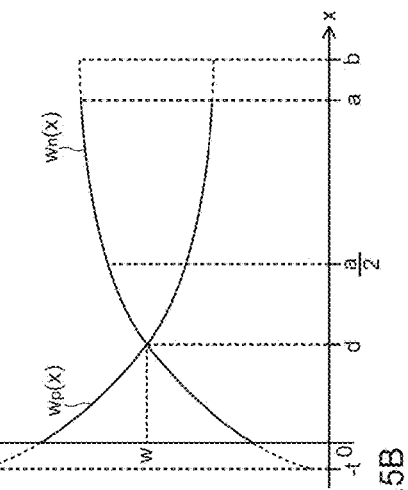
FIG. 5A to FIG. 5D are graphs expressing changes when a super junction structure 117 is depleted by turning off a MOSFET 100 according to Embodiment 1, that is, a change in width $w_n(x)$ at a predetermined depth position of an n-type column region 114 with respect to a depth x, a change in a width $w_p(x)$ at a predetermined depth position in a p-type column region 116 with respect to the depth x, a change in average density $N_d(x)$ of a positive charge at a predetermined depth position of the n-type column region 114 with respect to the depth x, a change in average density $N_a(x)$ of a negative charge at a predetermined depth position of the p-type column region 116 with respect to the depth x, and a change in average positive charge density $\rho(x)$ and an electric field $E(x)$ at the predetermined depth position of the super junction structure 117 with respect to the depth x.

With respect to the n-type column region 114 and the p-type column region 116, in a graph where the depth x at the predetermined depth position in the super junction structure is taken on an axis of abscissas, and a width $w_n(x)$ at the predetermined depth position in the n-type column region or a width $w_p(x)$ at the predetermined depth position in the p-type column region is taken on an axis of ordinates, the width $w_n(x)$ is expressed by an upward convex curve projecting in a right upward direction, and the width $w_p(x)$ is expressed by a downward convex curve projecting in a right downward direction (see FIG. 5A). That is, the n-type column region 114 has a shape of a cup with its open side down in cross section, while the p-type column region 116 has a shape of a funnel in cross section. Dopant concentration in the n-type column region 114 and dopant concentration in the p-type column region 116 are set to a fixed value regardless of depth (see FIG. 5B).

All of the n-type column regions 114, the p-type column regions 116, the source regions 120, the trenches 122 and the gate electrodes 126 are formed in a stripe shape as viewed in a plan view.

A thickness of the low-resistance semiconductor layer 112 falls within a range of 100 μm to 400 μm, for example, and dopant concentration in the low-resistance semiconductor layer 112 falls within a range of $1\times10^{19}$ cm$^{-3}$ to $1\times10^{20}$ cm$^{-3}$, for example. A thickness of the n-type semiconductor layer 115 falls within a range of 5 μm to 120 μm, for example. Dopant concentration in the n-type semiconductor layer 115 falls within a range of $5\times10^{13}$ cm$^{-3}$ to $1\times10^{16}$ cm$^{-3}$, for example. Dopant concentration of the p-type column region 116 falls within a range of $5\times10^{13}$ cm$^{-3}$ to $1\times10^{16}$ cm$^{-3}$, for example. A depth position of a deepest portion of the base region 118 falls within a range of 0.5 μm to 4.0 μm, for example, and dopant concentration in the base region 118 falls within a range of $5\times10^{16}$ cm$^{-3}$ to $1\times10^{18}$ cm$^{-3}$, for example. A depth position of a deepest portion of the source region 120 falls within a range of 0.1 μm to 0.4 μm, for example, and dopant concentration in the source region 120 falls within a range of $5\times10^{19}$ cm$^{-3}$ to $2\times10^{20}$ cm$^{-3}$, for example.

The trench 122 is formed in a region where the n-type column region 114 is positioned as viewed in a plan view. The trench 122 is formed such that the trench 122 extends from a surface of a first main surface of the semiconductor base substrate 110 to a depth position deeper than a deepest portion of the base region 118 and a portion of the source region 120 is exposed to an inner peripheral surface of the trench 122. A depth of the trench 122 is 5 μm for example.

The gate electrode 126 is embedded in the inside of the trench 122 by way of the gate insulation film 124 formed on an inner peripheral surface of the trench 122. The gate insulation film 124 is formed of a silicon dioxide film formed by a thermal oxidation method and the gate insulation film 124 has a thickness of 100 nm, for example. The gate electrode 126 is formed by a CVD method and an ion implantation method and is made of low-resistance polysilicon.

The interlayer insulation film 128 is formed so as to cover a portion of the source region 120, the gate insulation film 124 and the gate electrode 126. The interlayer insulation film 128 is formed by a CVD method and is formed of a PSG film having a thickness of 1000 nm, for example.

The source electrode 130 is formed so as to cover the base region 118, portions of the source regions 120, and the interlayer insulation film 128 and electrically connected with the source region 120. The drain electrode 132 is formed on a surface of the low-resistance semiconductor layer 112. The source electrode 130 is made of aluminum-based metal (Al—Cu-based alloy, for example) having a thickness of 4 μm formed by a sputtering method, for example. The drain electrode 132 is formed of a multi-layered metal film such as a Ti—Ni—Au film. A total thickness of the multi-layered metal film is 0.5 μm, for example.

3. Average Positive Charge Density $\rho(x)$ at Predetermined Depth Position of Super Junction Structure To evaluate a charge amount of a positive charge in the n-type column region 114 and a charge amount of a negative charge in the p-type column region 116 when the MOSFET is turned off, average positive charge density $\rho(x)$ at a predetermined depth position of the super junction structure when the super junction structure is depleted by turning off the MOSFET (hereinafter, simply referred to as average positive charge density $\rho(x)$) is used.

Assuming a depth at a predetermined depth position in the super junction structure 117 (hereinafter, simply referred to as a depth x) as x using a deepest position of a surface of a depletion layer on the first main surface side when the depletion layer extends most in the super junction structure by turning off the MOSFET as a reference, average positive charge density $\rho(x)$ is expressed by the following formula (1).

[Formula 1]

$$\rho(x) = \frac{q}{2w}[w_n(x) \cdot N_d(x) - w_p(x) \cdot N_a(x)] \quad (1)$$

Figure 3:
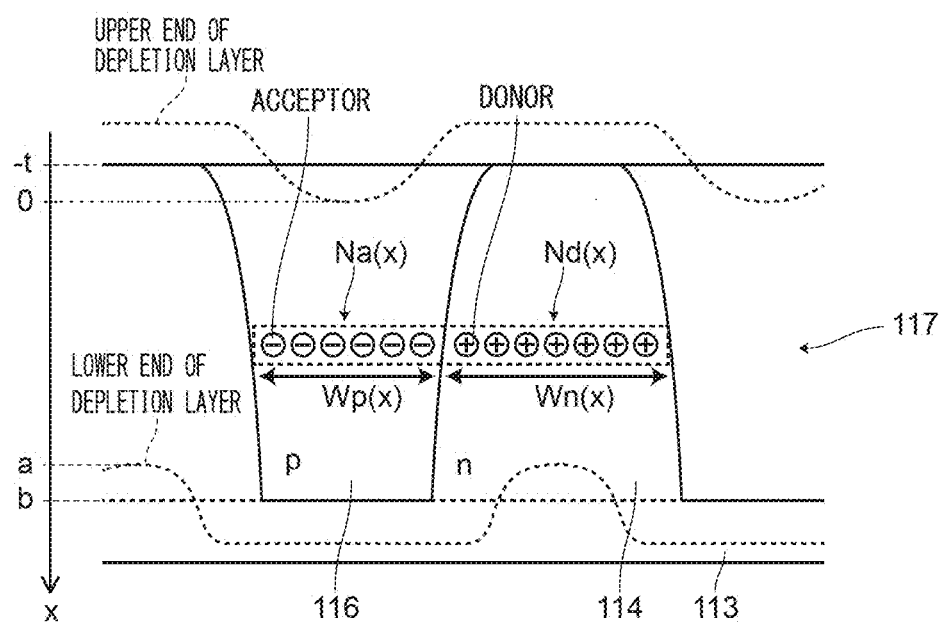
FIG. 3 is a schematic view for explaining an average positive charge density $\rho(x)$ at a predetermined depth position of a super junction structure when the super junction structure is depleted by turning off the MOSFET.

(In the formula (1), $w_n(x)$ indicates a width of the n-type column region 114 at the predetermined depth position, $N_d(x)$ indicates average density of a positive charge at the predetermined depth position in the n-type column region 114 when the super junction structure 117 is depleted by turning off the MOSFET, $w_p(x)$ indicates a width of the p-type column region at the predetermined depth position, $N_a(x)$ indicates average density of a negative charge at the predetermined depth position in the p-type column region 116 when the super junction structure 117 is depleted by turning off the MOSFET, q indicates an elementary charge, and w indicates a positive constant which satisfies $w_n(x)+w_p(x)=2w$. See FIG. 3.)

In Embodiment 1, in a state where a depletion layer extends most in the super junction structure by turning off the MOSFET, average positive charge density $\rho(x)$ within a range of $0 \leq x \leq a$ is evaluated assuming a deepest position of a surface of the depletion layer on a first main surface side as $x=0$ and a depth of a shallowest position of a surface of the depletion layer on the second main surface side as a.

In this embodiment, assuming that dopant concentration in the n-type column region 114 and dopant concentration in the p-type column region 116 are respectively set to a fixed value regardless of depth, $N_a(x)$ and $N_d(x)$ becomes $N_0$ ($N_a(x)=N_d(x)=N_0$) and hence, average positive charge density $\rho(x)$ is expressed by the following formula (2).

[Formula 2]

$$\rho(x) = \frac{qN_0}{2w}[w_n(x) - w_p(x)] \quad (2)$$

An electric field $E(x)$ at a predetermined depth position of the super junction structure 117 (hereinafter, simply referred to as an electric field $E(x)$) when the super junction structure 117 is depleted by turning off the MOSFET expresses an electric field generated by a positive charge (donor) at a predetermined depth position of the n-type column region 114 and an electric field generated by a negative charge (acceptor) at a predetermined depth position of the p-type column region 116 when the super junction structure 117 is depleted by turning off the MOSFET, and is expressed by the following formula (3).

[Formula 3]

$$E(x) = \int_0^x \frac{\rho(x)}{\varepsilon} dx \quad (3)$$

(In the formula (3), $\varepsilon$: dielectric constant of a material (for example, silicon) of a semiconductor base substrate)

To describe the MOSFET 100 according to Embodiment 1, a MOSFET 800 according to Comparative example 1 is described first.

Figure 8:
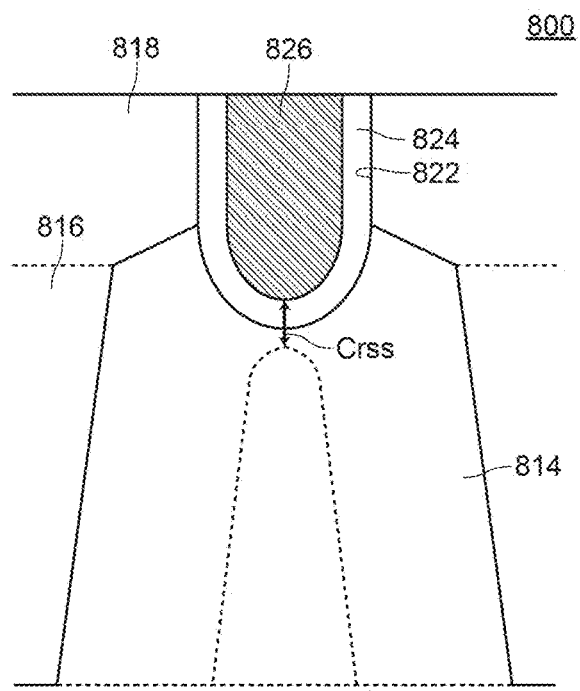
FIG. 8 is a schematic view showing a mode of a depletion layer at a moment during a turn-off period in the MOSFET 800 according to Comparative example 1.

The MOSFET 800 according to Comparative example 1 (see FIG. 8) basically has substantially the same structure as the MOSFET 100 according to Embodiment 1. However, in the same manner as the conventional MOSFET 900, the MOSFET 800 according to Comparative example 1 differs from the MOSFET 100 according to Embodiment 1 with respect to a point that side walls of the n-type column region 814 are formed in a tapered shape narrowed toward the first main surface side, and side walls of the p-type column region 816 are formed in a tapered shape with a narrow bottom.

Figure 4A:
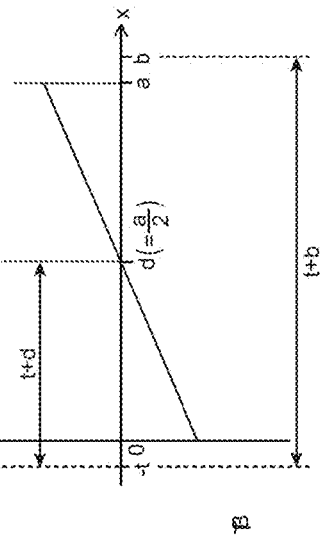
FIG. 4A to FIG. 4D are graphs expressing changes when a super junction structure is depleted by turning off a MOSFET 800 according to Comparative example 1, that is, a change in width $w_n(x)$ at a predetermined depth position of an n-type column region with respect to a depth x, a change in a width $w_p(x)$ at a predetermined depth position in a p-type column region with respect to the depth x, a change in average density $N_d(x)$ of a positive charge at a predetermined depth position of the n-type column region with respect to the depth x, a change in average density $N_a(x)$ of a negative charge at a predetermined depth position of the p-type column region with respect to the depth x, and a change in average positive charge density $\rho(x)$ and an electric field $E(x)$ at the predetermined depth position of the super junction structure with respect to the depth x.

In the MOSFET 800 according to Comparative example 1, in a graph where a depth x is taken on an axis of abscissas and a width $w_n(x)$ at a predetermined depth position in the n-type column region 814 or a width $w_p(x)$ at a predetermined depth position in the p-type column region 816 is taken on an axis of ordinates, the width $w_p(x)$ is expressed by a straight line extending in a right downward direction, and the width $w_n(x)$ is expressed by a straight line extending in a right upward direction (see FIG. 4A).

Figure 4C:
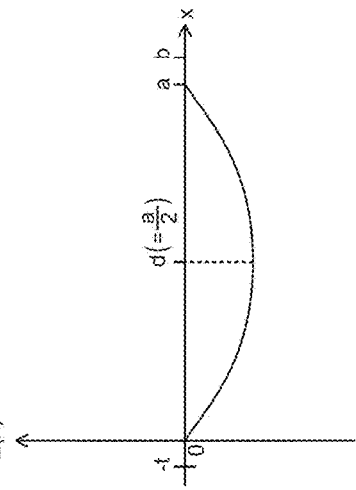
Figure 4B:
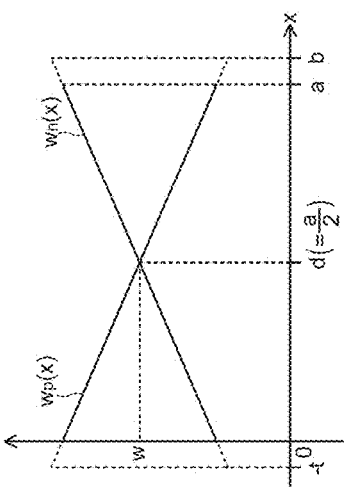

Further, in the MOSFET 800 according to Comparative example 1, in the same manner as the MOSFET 100 according to Embodiment 1, dopant concentration in the n-type column region 814 and dopant concentration in the p-type column region 816 are set to a fixed value regardless of depth (see FIG. 4B).

From the above, in the MOSFET 800 according to Comparative example 1, average positive charge density $\rho(x)$ is expressed by a straight line extending in a right upward direction (see FIG. 4C).

To describe the straight line which expresses average positive charge density $\rho(x)$ in detail, using a deepest position of a surface of a depletion layer on the first main surface side when the depletion layer extends most in the super junction structure by turning off the MOSFET as a reference, in a graph where an axis along a depth direction is set as an x axis, an x coordinate at a depth position of a lowermost surface of the base region is set as −t, an x coordinate at depth position of a lowermost portion of the p-type column region is set as b, and an x coordinate at a depth position where the average positive charge density $\rho(x)$ becomes 0 is set as d, and an x coordinate at a shallowest position of a surface of a depletion layer on a second main surface side when the depletion layer extends most in the super junction structure by turning off the MOSFET is set as a, the following (1) to (3) are established.

(1) The x coordinate d satisfies the relationship of $d=a/2$. That is, the depth at the depth position where the average positive charge density $\rho(x)$ becomes 0 becomes as follows. The depth d at the predetermined depth position when the average positive charge density $\rho(x)$ becomes 0 using a deepest position of a surface of a depletion layer on the first main surface side when the depletion layer extends most in the super junction structure by turning off the MOSFET as a reference becomes a depth half of the depth a at the shallowest position of a surface of a depletion layer on the second main surface side when the depletion layer extends most in the super junction structure by turning off the MOSFET (that is, a charge balance being taken at the depth position where $x=a/2$).

(2) A value of the average positive charge density $\rho(0)$ when $x=0$ is negative, and a value of the average positive charge density $\rho(a)$ at $x=a$ is positive.

(3) An area of a region surrounded by the straight line expressing the average positive charge density $\rho(x)$, the straight line at $x=0$ and the axis of abscissas (x axis) is equal to an area of a region surrounded by the straight line expressing the average positive charge density $\rho(x)$, the straight line at $x=a$ and the axis of abscissas (x axis).

Figure 4D:
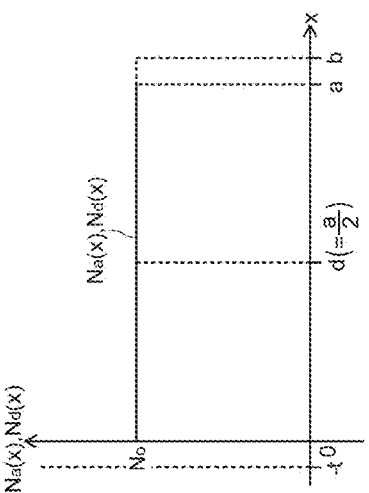

Further, in the MOSFET 800 according to Comparative example 1, an electric field $E(x)$ becomes a downwardly convex quadratic function having a peak at $x=a/2$ (see FIG. 4D). State where the electric field $E(x)$ becomes negative means that an electric field vector is directed in a direction that x approaches 0.

To the contrary, in the MOSFET 100 according to Embodiment 1, in a graph where the depth x is taken on an axis of abscissas, and a width $w_n(x)$ at the predetermined depth position in the n-type column region or a width $w_p(x)$ at the predetermined depth position in the p-type column region is taken on an axis of ordinates, the width $w_n(x)$ is expressed by a monotonous upward convex curve projecting in a right upward direction, and the width $w_p(x)$ is expressed by a monotonous downward convex curve projecting in a right downward direction (see FIG. 5A).

Figure 5C:
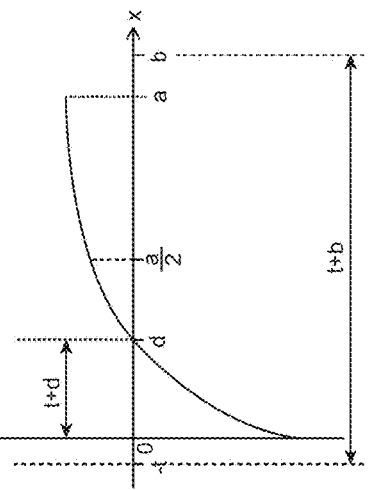
Figure 5B:
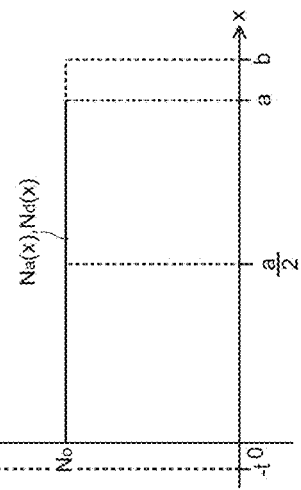

Further, in the MOSFET 100 according to Embodiment 1, dopant concentration in the n-type column region 114 and dopant concentration in the p-type column region 116 are set to a fixed value regardless of depth (see FIG. 5B).

From these, in the MOSFET 100 according to Embodiment 1, average positive charge density $\rho(x)$ is expressed by a monotonous upward convex curve projecting in a right upward direction (see FIG. 5C).

To describe the curve which expresses average positive charge density $\rho(x)$ in detail, using a deepest position of a surface of a depletion layer on the first main surface side when the depletion layer extends most in the super junction structure by turning off the MOSFET as a reference, in a graph where an axis along a depth direction is set as an x axis, an x coordinate at a depth position of a lowermost surface of the base region is set as −t, an x coordinate at the depth position of a lowermost portion of the p-type column region is set as b, and an x coordinate at a depth position where the average positive charge density $\rho(x)$ becomes 0 is set as d, and an x coordinate at a shallowest position of the surface of the depletion layer on a second main surface side when the depletion layer extends most in the super junction structure by turning off the MOSFET is set as a, the following relationships (1) to (4) are satisfied.

(1) The relationship of $0 < d < a/2$ is satisfied. That is, using a deepest position of a surface of a depletion layer on the first main surface side when the depletion layer extends most in the super junction structure by turning off the MOSFET as a reference, the depth d at a predetermined depth position when the average positive charge density $\rho(x)$ becomes 0 is shallower than a depth half of the depth a at the shallowest position of a surface of a depletion layer on the second main surface side when the depletion layer extends most in the super junction structure by turning off the MOSFET (that is, the depth position where a charge balance is taken is shallower than the depth position where a charge balance is taken in the MOSFET 800 according to Comparison example 1).

(2) A value of the average positive charge density $\rho(0)$ when x=0 is negative, and a value of the average positive charge density $\rho(a)$ at x=a is positive.

(3) An area of a region surrounded by the curve expressing the average positive charge density $\rho(x)$, the straight line at x=0 and the axis of abscissas (x axis) is equal to an area of a region surrounded by the curve expressing the average positive charge density $\rho(x)$, the straight line at x=a and the axis of abscissas (x axis).

(4) The relationship of $0 < t+d < (t+b)/2$ is satisfied.

Figure 5D:
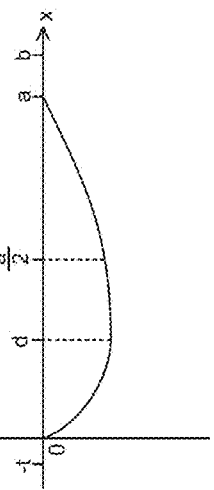

Further, an electric field E(x) becomes a downwardly convex quadratic function having a peak at x=d (see FIG. 5D). In this case, the electric field E(x) is rapidly decreased when x<d, and the electric field E(x) is gently increased when x>d.

4. Manner of Operation and Waveform of MOSFET 100 when MOSFET 100 is Turned Off

In the power conversion circuit 1 according to Embodiment 1, in the case where the MOSFET 800 according to Comparative example 1 is used in place of the MOSFET 100, the MOSFET 800 according to Comparative example 1 is operated as follows.

(1) Drain Current Id

In the case where a total amount of a dopant in the n-type column region and a total amount of a dopant in the p-type column region are equal (hereinafter referred to as "in the case of Just"), the MOSFET 800 is operated such that, during a period from a point of time that a drain current Id starts to be decreased to a point of time that the drain current Id becomes 0 for the first time, a period where the drain current Id is temporarily increased slightly appears (the MOSFET 800 being operated such that a hump waveform slightly appears in a waveform of the drain current Id, see Id (Just) in FIG. 6). The period from a point of time that a drain current Id starts to be decreased to a point of time that the drain current Id becomes 0 for the first time is approximately 0.02 μsec (20 nsec).

In the case where an irregularity exists in a charge balance such that a total amount of a dopant in the n-type column region is larger than a total amount of a dopant in the p-type column region (hereinafter referred to as "in the case of n-type dopant rich"), the MOSFET 800 is operated such that, during a period from a point of time that a drain current Id starts to be decreased to a point of time that the drain current Id becomes 0 for the first time, a period where the drain current Id is temporarily increased appears (the MOSFET 800 being operated such that a large hump waveform appears in a waveform of the drain current Id, see Id (n-type dopant rich) in FIG. 6). With respect to the hump waveform, the drain current Id is increased to a current value higher than a current value in the case of Just and, at the same time, a period until the drain current Id becomes 0 is largely prolonged compared to the case of Just (approximately 0.02 μsec (20 nsec) in the case of Just and approximately 0.04 μsec (40 nsec) in the case of n-type dopant rich).

In the case where a total amount of a dopant in the p-type column region is larger than a total amount of a dopant in the n-type column region (hereinafter referred to as "in the case of p-type dopant rich"), the MOSFET 800 is operated such that the drain current Id is monotonously decreased (the MOSFET 800 being operated such that no hump waveform appears in a waveform of the drain current Id, see Id (p-type dopant rich) in FIG. 6).

(2) Drain-Source Voltage Vds

In the case of n-type dopant rich, the MOSFET 800 is operated such that a drain-source voltage Vds is increased to approximately 350V more gently compared to the case of Just and, thereafter, the drain-source voltage Vds is gradually decreased and becomes stable at a power source voltage (300V). A time until a drain-source voltage Vds becomes stable from a point of time that the drain-source voltage Vds starts to be increased is longer than that of the case of Just and is approximately 0.05 μsec (50 nsec) (see Vds (n-type dopant rich) in FIG. 6).

Figure 6:
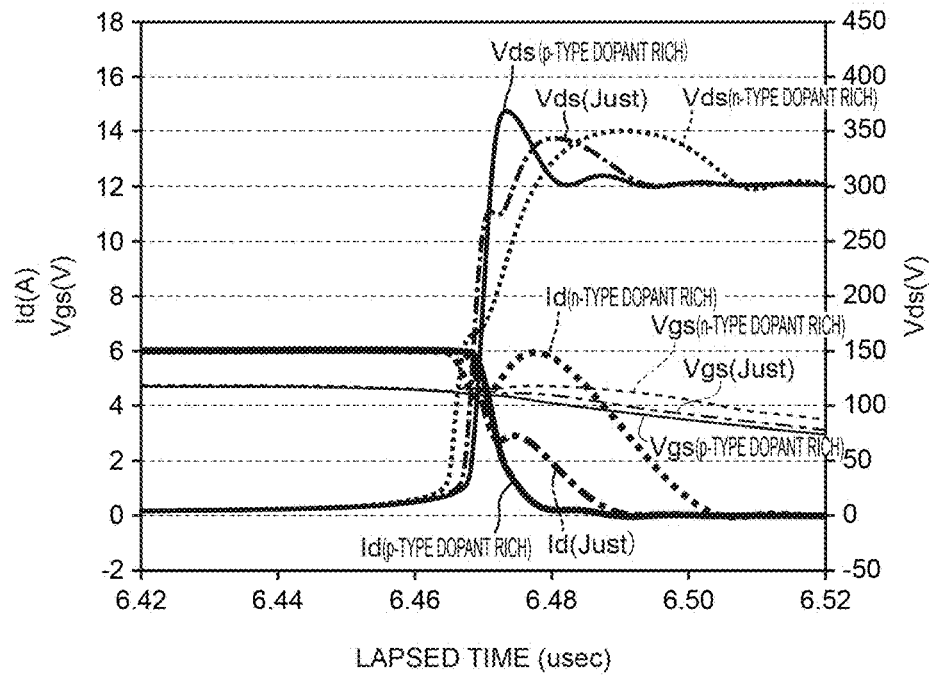
FIG. 6 is a graph showing a result of time transition simulation of a drain-source voltage Vds, a drain current Id and a gate-source voltage Vgs when a MOSFET 800 according to a Comparative example 1 is turned off in a power conversion circuit using the MOSFET 800.

In the case of p-type dopant rich, the MOSFET 800 is operated such that a drain-source voltage Vds is increased to approximately 370V more steeply compared to the case of Just and, thereafter, becomes stable at a power source voltage (300V) (see Vds (p-type dopant rich) in FIG. 6). A time until a drain-source voltage Vds becomes stable from a point of time that the drain-source voltage Vds starts to be increased is approximately 0.02 μsec (20 nsec).

(3) Gate-Source Voltage Vgs

In the case of n-type dopant rich, the MOSFET 800 is operated such that a period during which a gate-source voltage Vgs is temporarily increased slightly appears after completion of a mirror period (see Vgs (n-type dopant rich) in FIG. 6). On the other hand, in the case of Just and in the case of p-type dopant rich, the MOSFET 800 is operated such that a gate-source voltage Vgs minimally changes and is monotonously decreased (see Vgs (p-type dopant rich) and Vgs (Just) in FIG. 6).

As can be understood from the above-mentioned (1) to (3), in the MOSFET 800 according to the Comparative example 1, when an irregularity exists in a charge balance around the gate (in case such as Just being changed to an n-type dopant rich state or a p-type dopant rich state), an irregularity in switching characteristics when the MOSFET is turned off, particularly an irregularity in a drain current Id and a drain-source voltage Vds is increased. When an irregularity in a charge balance exists in an n-type dopant rich state, an irregularity in switching characteristics is particularly increased.

On the other hand, in the power conversion circuit 1 according to Embodiment 1, the MOSFET 100 according to Embodiment 1 is operated as follows.

(1) Drain Current Id

In all cases, that is, in case of Just, in case of n-type dopant rich and in case of p-type dopant rich, a turn-off period becomes short. Further, in all cases, the MOSFET 100 is operated such that the drain current Id adopts a similar waveform (see respective Id in FIG. 7). Particularly, in case of n-type dopant rich, a hump waveform hardly appears in a waveform of the drain current Id and hence, the MOSFET 100 is operated such that the waveform of the drain current Id becomes similar to a waveform of the drain current Id in case of Just and the drain current Id in case of p-type dopant rich.

(2) Drain-Source Voltage Vds

In all cases, that is, in case of Just, in case of n-type dopant rich and in case of p-type dopant rich, a turn-off period becomes short. Further, in all cases, the MOSFET is operated such that the drain-source voltage Vds adopts a similar waveform (see respective Vds in FIG. 7). Although ringing occurs in case of p-type dopant rich, ringing can be made small by including a mechanism to remove ringing such as a snubber circuit.

(3) Gate-Source Voltage Vgs

Figure 7:
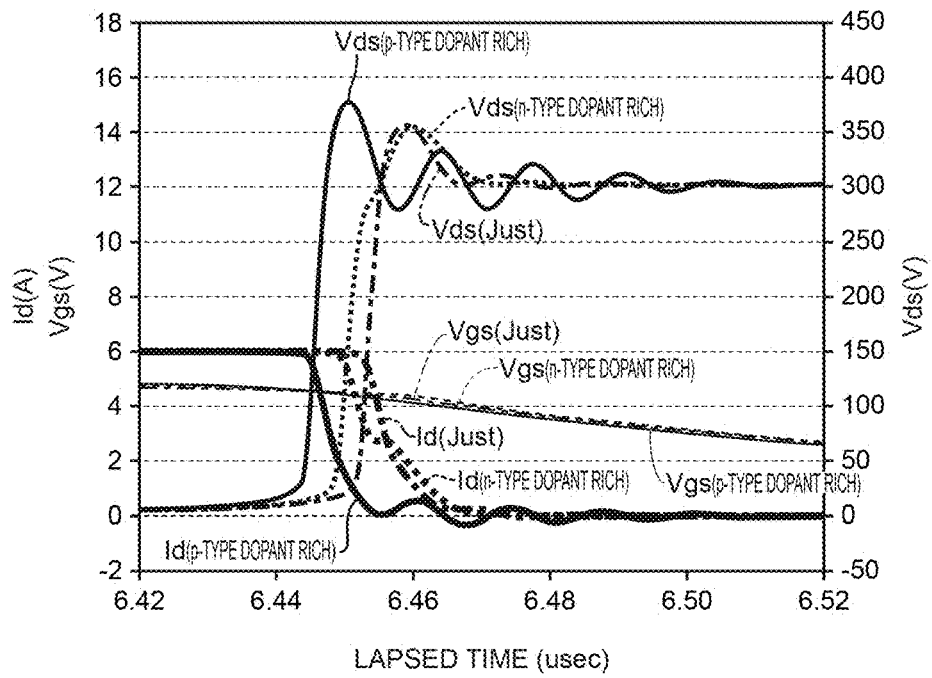
FIG. 7 is a graph showing a result of time transition simulation of a drain-source voltage Vds, a drain current Id and a gate-source voltage Vgs when a MOSFET according to Embodiment 1 is turned off in a power conversion circuit 1 according to Embodiment 1.

In all cases, that is, in case of Just, in case of n-type dopant rich and in case of p-type dopant rich, the MOSFET is operated such that there is substantially no difference in the gate-source voltage Vgs between these cases (see respective Vgs in FIG. 7).

As can be understood from the above-mentioned (1) to (3), in the MOSFET 100 according to Embodiment 1, even when an irregularity in a charge balance exists around the gate (case of Just being changed to case of an n-type dopant rich state, case of Just being changed to case of a p-type dopant rich state or the like), an irregularity in switching characteristics when the MOSFET is turned off can be made small.

Next, the reason is explained why the MOSFET 100 according to Embodiment 1 and the MOSFET 800 according to Comparative example 1 take the above-mentioned waveforms.

Firstly, in the MOSFET 800 according to Comparative example 1, when the MOSFET is turned off, the depletion layer extends to the n-type column region 814 and the p-type column region 816 from the PN junction between the p-type column region 816 (and the base region 818) and the n-type column region 814. However, in the MOSFET 800 according to Comparative example 1, although the depletion layer extends to an area directly below the trench, the depletion layer hardly extends to a drain electrode side and hence, it is difficult to increase a distance between the region which is not depleted in the n-type column region 814 and the gate electrode 826 whereby it is difficult to decrease a feedback capacitance Crss (see FIG. 8). Accordingly, the gate electrode 826 is liable to be easily affected by a change in potential of the n-type column region 814 and hence, when there is an irregularity in charge balance around the gate, it is difficult to decrease an irregularity in switching characteristic when the MOSFET is turned off.

Figure 9:
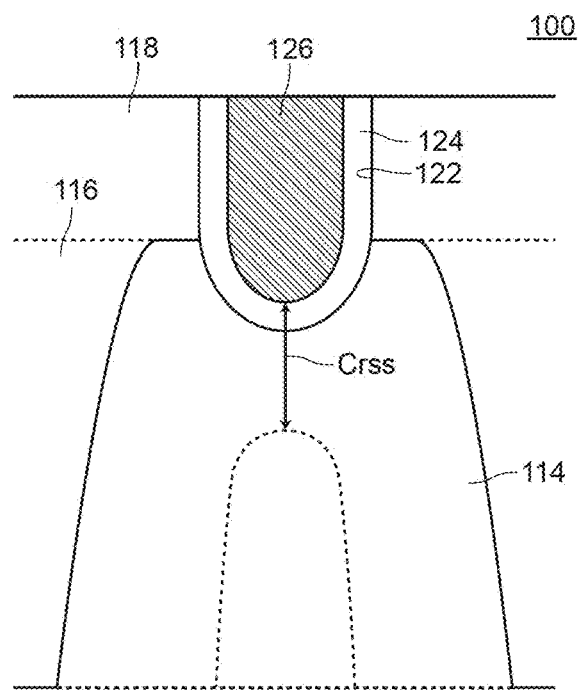
FIG. 9 is a schematic view showing a mode of a depletion layer at a moment during a turn-off period in the MOSFET 100 according to Embodiment 1.

To the contrary, in the MOSFET 100 according to Embodiment 1, the depletion layer easily extends to also a drain electrode side and hence, a distance between the region which is not depleted in the n-type column region 114 and the gate electrode 126 can be easily increased whereby a feedback capacitance Crss can be easily increased (see FIG. 9). Accordingly, the gate electrode 126 is minimally affected by a change in potential of the n-type column region 114 and hence, when there is an irregularity in charge balance around the gate, an irregularity in switching characteristic when the MOSFET is turned off can be decreased.

The above-mentioned reason is explained from an aspect of equal potential lines.

Figure 10A:
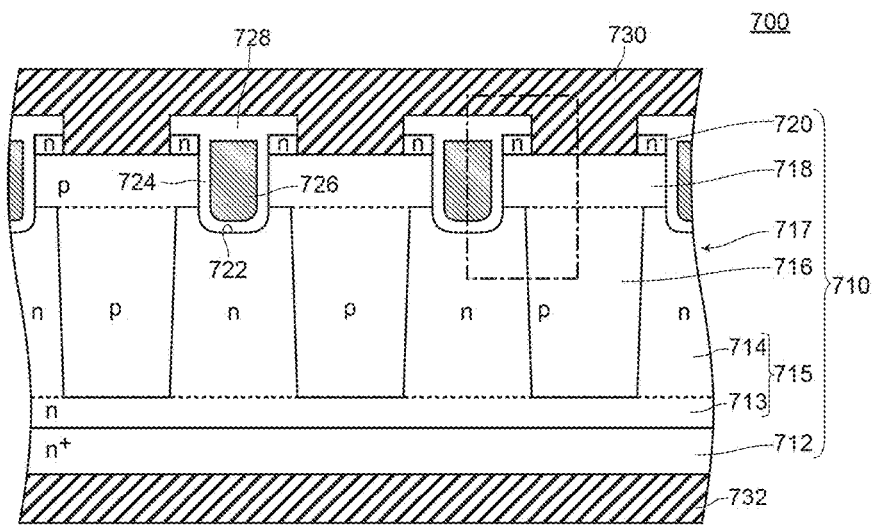
FIG. 10A and FIG. 10B are cross-sectional views showing a MOSFET 700 according to Comparative example 2 and a MOSFET 100A according to a present invention example.
Figure 10B:
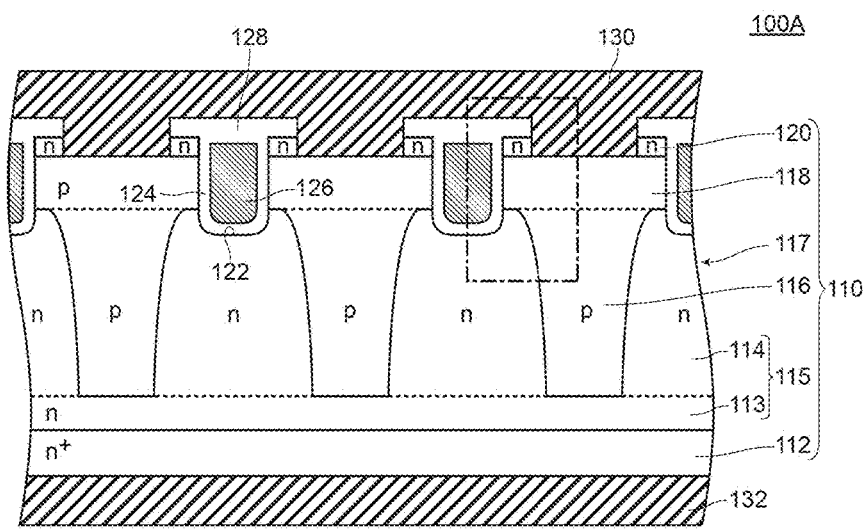

The MOSFET 700 according to Comparative example 2 is a MOSFET substantially having the same configuration as the MOSFET 800 according to Comparative example 1 except for a point that a portion of the MOSFET 700 which is brought into contact with the source electrode is dug to a depth position of a lowermost portion of the source region (see FIG. 10A). A MOSFET 100A according to a present invention example is a MOSFET substantially having the same configuration as the MOSFET 100 according to Embodiment 1 except for a point that a portion of the MOSFET 100A which is brought into contact with the source electrode is dug to a depth position of a lowermost portion of the source region (see FIG. 10B).

Figure 11B:
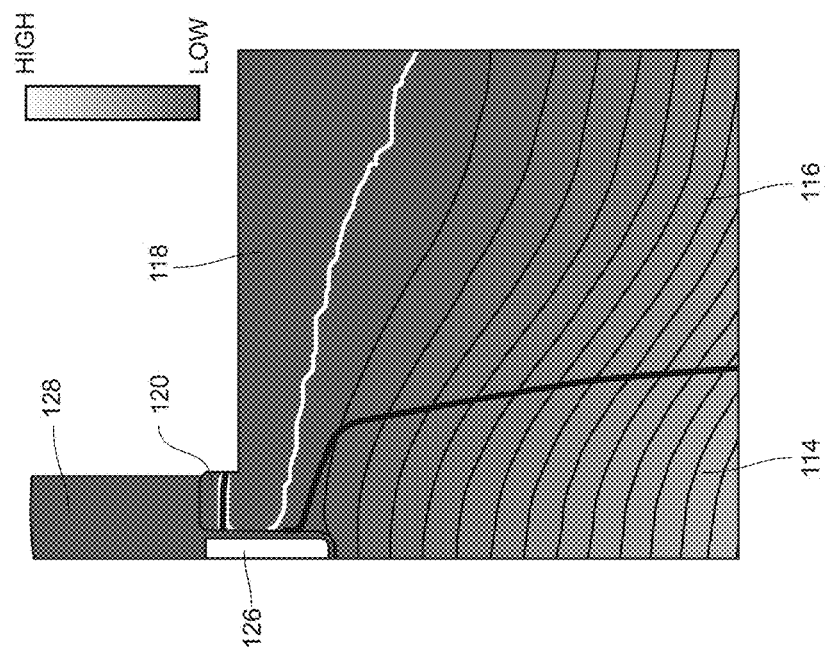
FIG. 11A and FIG. 11B are views showing a simulation result of equal potential lines when the MOSFET is turned off in the MOSFET 700 according to the Comparative example 2 and the MOSFET 100A according to the present invention example.
Figure 11A:
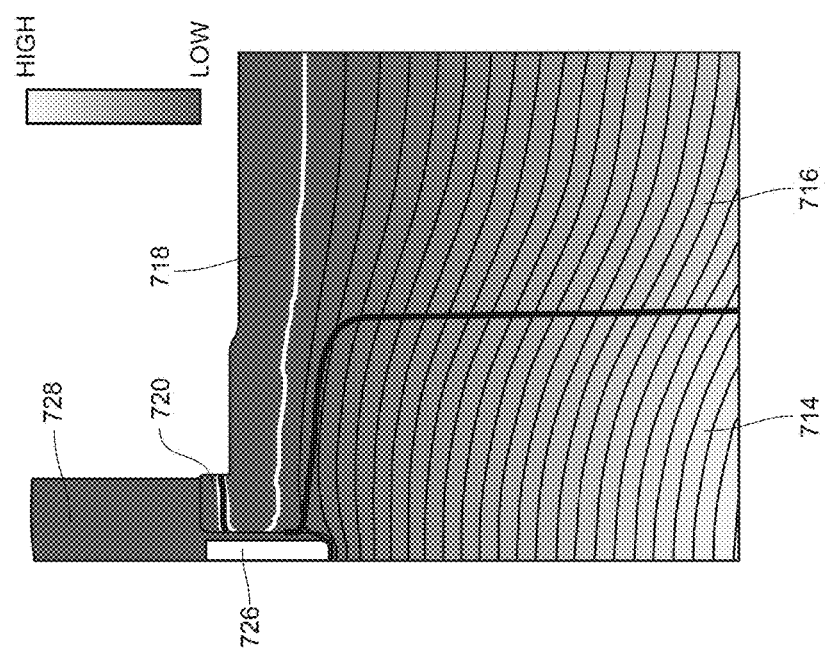

In the MOSFET 700 according to Comparative example 2, when the MOSFET is turned off, a state arises where a distance between the equal potential lines on a bottom portion of the trench is narrow (see FIG. 11A). This is because a distance between a non-depleted region in the n-type column region 714 and the gate electrode 726 is short. Accordingly, a potential gradient in the vicinity of the bottom portion of the trench is increased and hence, the gate electrode 726 is liable to be easily affected by a change in potential of the n-type column region 714. Accordingly, when an irregularity occurs in a charge balance around the gate, it is difficult to decrease an irregularity in switching characteristics when the MOSFET 700 is turned off.

On the other hand, in the MOSFET 100A according to the present invention example, when the MOSFET is turned off, a state arises where a distance between the equal potential lines on a bottom portion of the trench 122 is wide (see FIG. 11B). This is because a distance between a non-depleted region in the n-type column region 114 and the gate electrode 126 is long. Accordingly, a potential gradient in the vicinity of the bottom portion of the trench 122 is decreased and hence, the gate electrode 126 is minimally affected by a change in potential of the n-type column region 114. Accordingly, even when an irregularity occurs in a charge balance around the gate, an irregularity in switching characteristics when the MOSFET 100A is turned off can be decreased.

5. Advantageous Effects Acquired by MOSFET 100 and Power Conversion Circuit 1 According to Embodiment 1

According to the MOSFET 100 and the power conversion circuit 1 of Embodiment 1, average positive charge density $\rho(x)$ at a predetermined depth position of the super junction structure 117 when the super junction structure 117 is depleted by turning off the MOSFET is expressed by an upward convex curve projecting in a right upward direction. With such a configuration, in a depth position around the gate (a region where x is close to 0), the average positive charge density ρ(x) becomes smaller than (larger on a negative side) a conventional MOSFET 900, and the difference between a charge amount of a negative charge in the p-type column region 116 and a charge amount of a positive charge in the n-type column region 114 becomes large compared to the conventional MOSFET 900. Accordingly, the following advantages can be acquired.

(1) The n-type column region 114 around the gate becomes easily depleted compared to the conventional MOSFET 900 and hence, even when a drain voltage is increased, a potential of the n-type column region 114 around the gate is minimally increased.

(2) A distance between a non-depleted region in the n-type column region 114 and the gate electrode 126 becomes long compared to the conventional MOSFET 900 and hence, a feedback capacitance Crss (equal to a gate-drain capacitance Cgd) becomes small compared to the conventional MOSFET 900. Accordingly, even when a potential of the n-type column region 114 (the non-depleted region of the n-type column region 114) is increased along with the increase of a drain voltage which takes place when the MOSFET is turned off, the gate electrode 126 is minimally affected by a change in potential of the n-type column region 114. As a result, even when an irregularity exists in a charge balance around the gate, an irregularity in switching characteristics when the MOSFET is turned off can be reduced compared to the prior art.

Further, according to the MOSFET 100 of Embodiment 1, average positive charge density ρ(x) at a predetermined depth position of the super junction structure 117 when the super junction structure 117 is depleted by turning off the MOSFET is expressed as an upward convex curve projecting in a right upward direction. With such a configuration, at a depth position around the gate, an average positive charge density ρ(x) becomes small (large on a negative side) and hence, a charge amount of a negative charge in the p-type column region 116 becomes larger than a charge amount of a positive charge in the n-type column region. Accordingly, holes around the gate in the p-type column region can be easily extracted by a negative charge in the p-type column region 116. As a result, an L-load avalanche breakdown resistance can be increased.

Further, the MOSFET 100 according to Embodiment 1 includes the semiconductor base substrate 110 where the super junction structure 117 is formed of the n-type column region 114 and the p-type column region 116. Accordingly, in the same manner as the conventional MOSFET 900, the MOSFET becomes a switching element having a low ON resistance and a high withstand voltage.

In the MOSFET 100 according to Embodiment 1, the average positive charge density ρ(0) when x=0 takes a negative value, and the average positive charge density ρ(a) when x=a takes a positive value. Accordingly, at a depth position in the vicinity of a bottom portion of the p-type column region 116, a total amount of a dopant in the p-type column region 116 becomes smaller than a total amount of a dopant in the n-type column region 114 (becoming n-type dopant rich). With such a configuration, a depletion layer generated from the p-type column region 116 when the MOSFET is turned off minimally extends toward a second main surface side. Accordingly, it is possible to provide an MOSFET where a breakdown in a reach through mode minimally occurs so that a withstand voltage is minimally lowered.

In the MOSFET 100 according to Embodiment 1, using a deepest position of a surface of a depletion layer on the first main surface side when the depletion layer extends most in the super junction structure 117 by turning off the MOSFET as a reference, assuming a depth of a surface of the depletion layer on the second main surface side at a shallowest position when the depletion layer extends most in the super junction structure 117 by turning off the MOSFET as a, and a depth of a depth position where the average positive charge density ρ(x) becomes 0 in the super junction structure 117 as d, a relationship of 0<d<a/2 be satisfied. Accordingly, the difference between a charge amount of a negative charge in the p-type column region 116 and a charge amount of a positive charge in the n-type column region 114 becomes large at a depth position around the gate and hence, the n-type column region 114 around the gate becomes easily depleted. Accordingly, even when an irregularity exists in a charge balance around the gate, an irregularity in switching characteristics when the MOSFET is turned off can be further reduced.

In the MOSFET 100 according to Embodiment 1, in a graph where the depth x at the predetermined depth position in the super junction structure 117 is taken on an axis of abscissas, and a width $w_n(x)$ at the predetermined depth position in the n-type column region 114 or a width $w_p(x)$ at the predetermined depth position in the p-type column region 116 is taken on an axis of ordinates, the width $w_p(x)$ is expressed by a downward convex curve projecting in a right downward direction, and the width $w_n(x)$ is expressed by an upward convex curve projecting in a right upward direction. Accordingly, in implanting a dopant in steps of manufacturing a semiconductor device, it is unnecessary to perform a complicated step that concentration of a dopant to be implanted is changed corresponding to a depth.

The MOSFET 100 according to Embodiment 1 is a trench-gate-type MOSFET. With such a configuration, also in the trench-gate-type MOSFET where the gate electrode and the drain electrode are arranged close to each other so that a potential of the n-type column region 114 around the gate is liable to be increased compared to a planar-gate-type MOSFET, it is possible to reduce irregularity in switching characteristics when the MOSFET is turned off compared to a prior art.

In the power conversion circuit 1 according to Embodiment 1, using a deepest position of a surface of a depletion layer on the first main surface side when the depletion layer extends most in the super junction structure 117 by turning off the MOSFET as a reference, in a graph where an axis along a depth direction is set as an x axis, an x coordinate at a depth position of a lowermost surface of the base region is set as −t, an x coordinate at depth position of a lowermost portion of the p-type column region 116 is set as b, and an x coordinate at a depth position where the average positive charge density ρ(x) becomes 0 is set as d, a relationship of 0<t+d<(t+b)/2 is satisfied. With such a configuration, the difference between a charge amount of a negative charge in the p-type column region 116 and a charge amount of a positive charge in the n-type column region 114 becomes large at a depth position around the gate and hence, the n-type column region 114 around the gate becomes easily depleted. As a result, even when an irregularity exists in a charge balance around the gate, an irregularity in switching characteristics when the MOSFET is turned off can be further reduced.

In the MOSFET 100 according to Embodiment 1, the rectifier element is a fast recovery diode and hence, a turn-off period is short and hence, when the MOSFET is turned off, a potential of the n-type column region 114 is minimally increased along with the increase of a drain voltage. Accordingly, a potential of the gate electrode is also minimally increased. As a result, even when an irregularity exists in a charge balance around the gate, an irregularity in switching characteristics when the MOSFET is turned off can be further reduced.

Embodiment 2

Figure 12A:
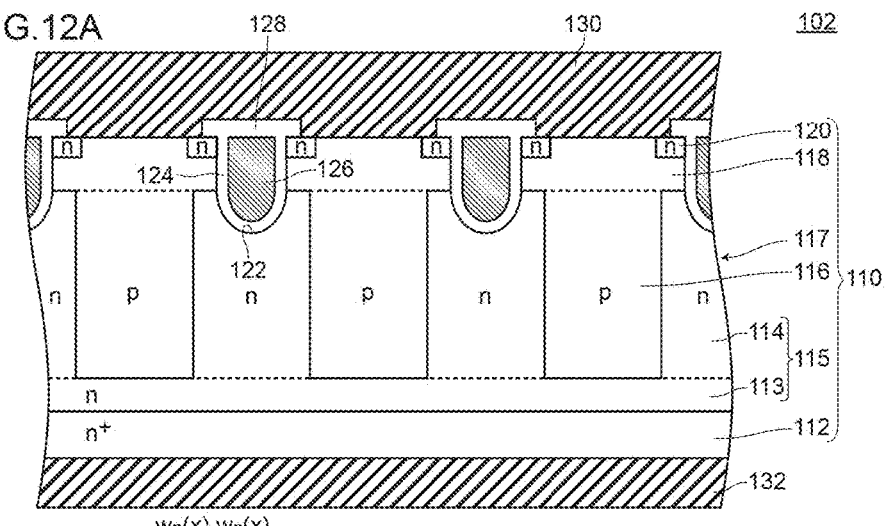
FIG. 12A to FIG. 12C are views for explaining a MOSFET 102 according to Embodiment 2.
Figure 12B:
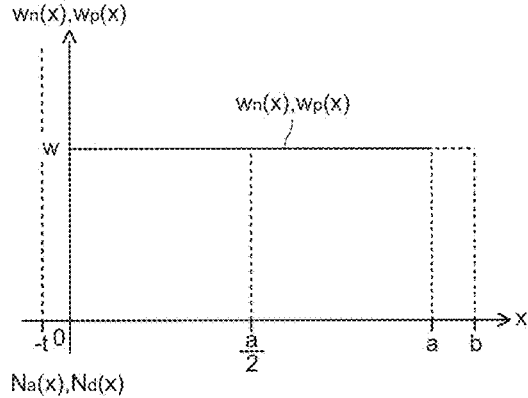
Figure 12C:
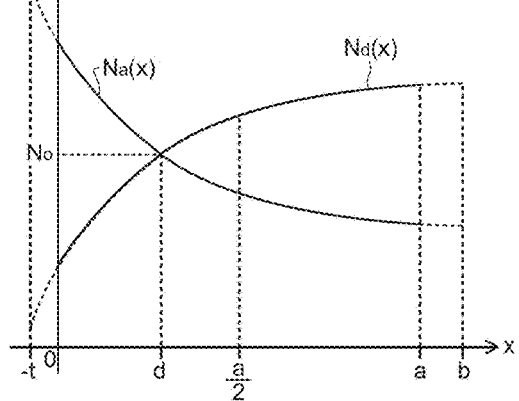

MOSFET 102 according to Embodiment 2 basically has substantially the same structure as MOSFET 100 according to Embodiment 1. However, MOSFET 102 according to Embodiment 2 differs from MOSFET 100 according to Embodiment 1 with respect to a point that average density $N_d(x)$ of a positive charge at the predetermined depth position in the n-type column region and average density $N_a(x)$ of a negative charge at the predetermined depth position in the p-type column region when the super junction structure is depleted by turning off the MOSFET are changed in place of changing of a width $w_n(x)$ at a predetermined depth position of an n-type column region and a width $w_p(x)$ at a predetermined depth position in a p-type column region. That is, in the MOSFET 102 according to Embodiment 2, as shown in FIG. 12A to FIG. 12C, in a graph where a depth x is taken on an axis of abscissas, average density $N_d(x)$ of a positive charge at the predetermined depth position in the n-type column region 114 or average density $N_a(x)$ of a negative charge at the predetermined depth position in the p-type column region 116 is taken on an axis of ordinates, average density $N_d(x)$ of a positive charge is expressed by a monotonous upward convex curve projecting in a right upward direction, and average density $N_a(x)$ of a negative charge is expressed by a monotonous downward convex curve projecting in a right downward direction (see FIG. 12C). The width of the n-type column region 114 and the width of the p-type column region 116 are set to a fixed value regardless of depth (see FIG. 12B).

In this manner, the MOSFET 102 according to Embodiment 2 differs from the MOSFET 100 according to Embodiment 1 with respect to the point that average density $N_d(x)$ of a positive charge at the predetermined depth position in the n-type column region and average density $N_a(x)$ of a negative charge at the predetermined depth position in the p-type column region when the super junction structure is depleted by turning off the MOSFET are changed in place of changing of a width $w_p(x)$ at a predetermined depth position in a p-type column region and a width $w_n(x)$ at a predetermined depth position of an n-type column region. However, in the same manner as the MOSFET 100 according to Embodiment 1, average positive charge density $\rho(x)$ at a predetermined depth position of the super junction structure 117 when the super junction structure 117 is depleted by turning off the MOSFET is expressed by an upward convex curve projecting in a right upward direction. With such a configuration, in a depth position around the gate (a region where x is close to 0), the average positive charge density $\rho(x)$ becomes smaller than (larger on a negative side) a conventional MOSFET 900, and the difference between a charge amount of a negative charge in the p-type column region and a charge amount of a positive charge in the n-type column region becomes large compared to the conventional MOSFET 900. Accordingly, the following advantages can be acquired.

(1) The n-type column region 114 around the gate becomes easily depleted compared to the conventional MOSFET 900 and hence, even when a drain voltage is increased, a potential of the n-type column region 114 around the gate is minimally increased.

(2) A distance between a non-depleted region in the n-type column region 114 and the gate electrode 126 becomes long and hence, a feedback capacitance Crss becomes small compared to the conventional MOSFET 900. Accordingly, even when a potential of the n-type column region 114 (the non-depleted region of the n-type column region) is increased along with the increase of a drain voltage which takes place when the MOSFET is turned off, the gate electrode 126 is minimally affected by a change in potential of the n-type column region 114. Accordingly, even when an irregularity exists in a charge balance around the gate, an irregularity in switching characteristics when the MOSFET is turned off can be reduced compared to the prior art.

The MOSFET 102 according to Embodiment 2 has substantially the same structure as the MOSFET 100 according to Embodiment 1 except for the point that average density $N_d(x)$ of a positive charge at the predetermined depth position in the n-type column region and average density $N_a(x)$ of a negative charge at the predetermined depth position in the p-type column region when the super junction structure is depleted by turning off the MOSFET are changed in place of changing of a width $w_n(x)$ at a predetermined depth position of an n-type column region and a width $w_p(x)$ at a predetermined depth position in a p-type column region. Accordingly, the MOSFET 102 according to Embodiment 2 can acquire the advantageous effects by the constitutional parts corresponding to the corresponding constitutional parts of the MOSFET 102 according to Embodiment 2 among the advantageous effects acquired by the MOSFET 100 according to Embodiment 1.

Embodiment 3

Figure 13:
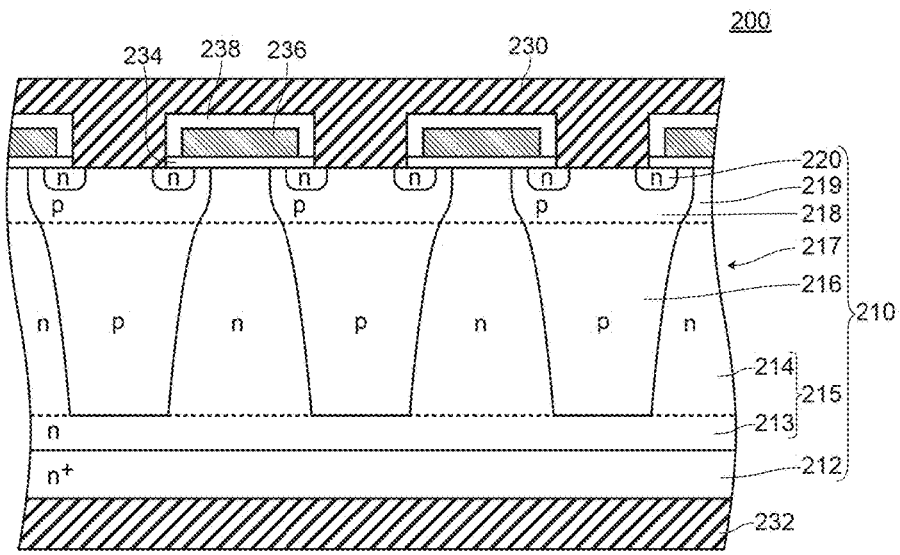
FIG. 13 is cross-sectional view showing a MOSFET 200 according to Embodiment 3.

MOSFET 200 according to Embodiment 3 basically has substantially the same structure as MOSFET 100 according to Embodiment 1. However, MOSFET 200 according to Embodiment 3 differs from MOSFET 100 according to Embodiment 1 with respect to a point that the MOSFET 200 according to Embodiment 3 is not a trench-gate-type MOSFET but is a planar-gate-type MOSFET. That is, in the MOSFET 200 according to Embodiment 3, as shown in FIG. 13, a semiconductor base substrate 210 has: a base region 218 which is formed on a surface of a first main surface of the semiconductor base substrate 210, a whole surface of a p-type column region 216 and on a portion of a surface of an n-type column region 214; an n-type surface high concentration region 219 formed on a surface of a first main surface of the semiconductor base substrate 210 and on a surface of the n-type column region 214 in a state where the n-type surface high concentration region 219 is disposed adjacently to a base region 218; and an n-type source region 220 formed on a surface of the base region 218. A gate electrode 236 is formed on the surface of the base region 218 sandwiched between source regions 220 and n-type surface high concentration regions 219 by way of gate insulation films 234. A depth position of the n-type surface high concentration region 219 falls within a range of 1.0 μm to 4.0 μm, and dopant concentration of the n-type surface high concentration region 219 falls within a range of $1 \times 10^{14}$ cm$^{-3}$ to $1 \times 10^{16}$ cm$^{-3}$.

In this manner, the MOSFET 200 according to Embodiment 3 differs from the MOSFET 100 according to Embodiment 1 with respect to the point that the MOSFET 200 according to Embodiment 3 is not a trench-gate-type MOSFET but is a planar-gate-type MOSFET. However, in the same manner as the MOSFET 100 according to Embodiment 1, average positive charge density $\rho(x)$ at a predetermined depth position of the super junction structure 217 when the super junction structure 217 is depleted by turning off the MOSFET is expressed by an upward convex curve projecting in a right upward direction. With such a configuration, in a depth position around the gate (a region where x is close to 0), the average positive charge density ρ(x) becomes smaller than (larger on a negative side) a conventional MOSFET 900, and the difference between a charge amount of a negative charge in the p-type column region 216 and a charge amount of a positive charge in the n-type column region 214 becomes large compared to the conventional MOSFET 900. Accordingly, the following advantages can be acquired.

(1) A n-type column region 214 around a gate becomes easily depleted compared to a conventional MOSFET and hence, even when a drain voltage is increased, a potential of the n-type column region 214 around the gate is minimally increased.

(2) A distance between a non-depleted region in the n-type column region 214 and a gate electrode 236 becomes long and hence, a feedback capacitance Crss becomes small compared to a conventional MOSFET. Accordingly, even when a potential of the n-type column region 214 (the non-depleted region of the n-type column region) is increased along with the increase of a drain voltage which takes place when the MOSFET is turned off, the gate electrode 236 is minimally affected by a change in potential of the n-type column region 214. Accordingly, even when an irregularity exists in a charge balance around the gate, an irregularity in switching characteristics when the MOSFET is turned off can be reduced compared to the prior art.

The MOSFET 200 according to Embodiment 3 has substantially the same structure as the MOSFET 100 according to Embodiment 1 except for the point that the MOSFET 200 according to Embodiment 3 is not a trench-gate-type MOSFET but is a planar-gate-type MOSFET. Accordingly, the MOSFET 200 according to Embodiment 3 can acquire the advantageous effects by the constitutional parts corresponding to the corresponding constitutional parts of the MOSFET 100 according to Embodiment 1 among the advantageous effects acquired by the MOSFET 100 according to Embodiment 1.

Embodiment 4

Figure 14:
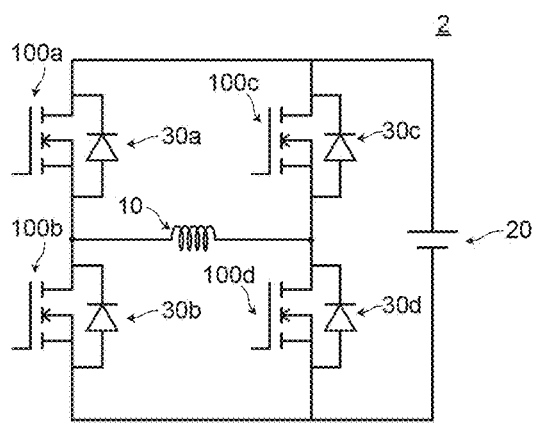
FIG. 14 is a circuit diagram showing a power conversion circuit 2 according to Embodiment 4.

A power conversion circuit 2 according to Embodiment 4 basically has substantially the same structure as the power conversion circuit 1 according to Embodiment 1. However, the power conversion circuit 2 according to Embodiment 4 differs from the power conversion circuit 1 according to Embodiment 1 with respect to a point that the power conversion circuit is a full bridge circuit. That is, the power conversion circuit 2 according to Embodiment 4 includes, as shown in FIG. 14, four MOSFETs 100 (100a to 100d) as MOSFET, and also includes built-in diodes of the respective MOSFETs as rectifying elements.

In this manner, the power conversion circuit 2 according to Embodiment 4 differs from the power conversion circuit 1 according to Embodiment 1 with respect to the point that the power conversion circuit 2 is a full bridge circuit. However, in the same manner as the power conversion circuit 1 according to Embodiment 1, average positive charge density ρ(x) at a predetermined depth position of the super junction structure 117 when the super junction structure 117 is depleted by turning off the MOSFET is expressed by an upward convex curve projecting in a right upward direction. With such a configuration, in a depth position around the gate (a region where x is close to 0), the average positive charge density ρ(x) becomes smaller than (larger on a negative side) a conventional MOSFET 900, and the difference between a charge amount of a negative charge in the p-type column region 116 and a charge amount of a positive charge in the n-type column region 114 becomes large compared to the conventional MOSFET 900. Accordingly, the following advantages can be acquired.

(1) The n-type column region 114 around the gate becomes easily depleted compared to a conventional MOSFET and hence, even when a drain voltage is increased, a potential of the n-type column region 114 around a gate is minimally increased.

(2) A distance between a non-depleted region in the n-type column region 114 and a gate electrode 126 becomes long and hence, a feedback capacitance Crss becomes small compared to the conventional MOSFET. Accordingly, even when a potential of the n-type column region 114 (the non-depleted region of the n-type column region) is increased along with the increase of a drain voltage which takes place when the MOSFET is turned off, the gate electrode 126 is minimally affected by a change in potential of the n-type column region 114. Accordingly, even when an irregularity exists in a charge balance around the gate, an irregularity in switching characteristics when the MOSFET is turned off can be reduced compared to the prior art.

In the power conversion circuit 2 according to Embodiment 4, average positive charge density ρ(x) at the predetermined depth position in the super junction structure 117 when the super junction structure 117 is depleted by turning off the MOSFET is expressed by an upward convex curve projecting in a right upward direction. Accordingly, as described above, even when a potential of the n-type column region 114 (the non-depleted region of the n-type column region 114) is increased along with the increase of a drain voltage which takes place when the MOSFET is turned off, the gate electrode 126 is minimally affected by a change in potential of the n-type column region 114. Accordingly, a phenomenon referred to as false turn-on (erroneous turn-on) minimally occurs.

The phenomenon referred to as false turn-on (erroneous turn-on) is a phenomenon where, in a circuit where two or more MOSFETs are connected to each other, when either one of the MOSFETs is turned on, another MOSFET is also turned on by an error due to a change in potential.

Further, according to the power conversion circuit 2 of Embodiment 4, a rectifier element is the built-in diode in the MOSFET and hence, it is unnecessary to additionally prepare a rectifier element.

The power conversion circuit 2 according to Embodiment 4 has substantially the same structure as the power conversion circuit 1 according to Embodiment 1 except for the point that the power conversion circuit is a full bridge circuit. Accordingly, the power conversion circuit 2 according to Embodiment 4 can acquire the advantageous effects by the constitutional parts corresponding to the corresponding constitutional parts of the power conversion circuit 2 according to Embodiment 4 among the advantageous effects acquired by the power conversion circuit 1 according to Embodiment 1.

Although the present invention has been described with reference to the above-described Embodiments, the present invention is not limited to the above-described Embodiments. The present invention can be carried out in various modes without departing from the gist of the present invention. For example, the following modifications are also conceivable.

(1) The numbers, materials, shapes, positions, sizes and the like of the constitutional elements described in the above-mentioned respective Embodiments are provided only for an exemplifying purpose, and can be changed within a scope where advantageous effects of the present invention are not impaired.

Figure 15:
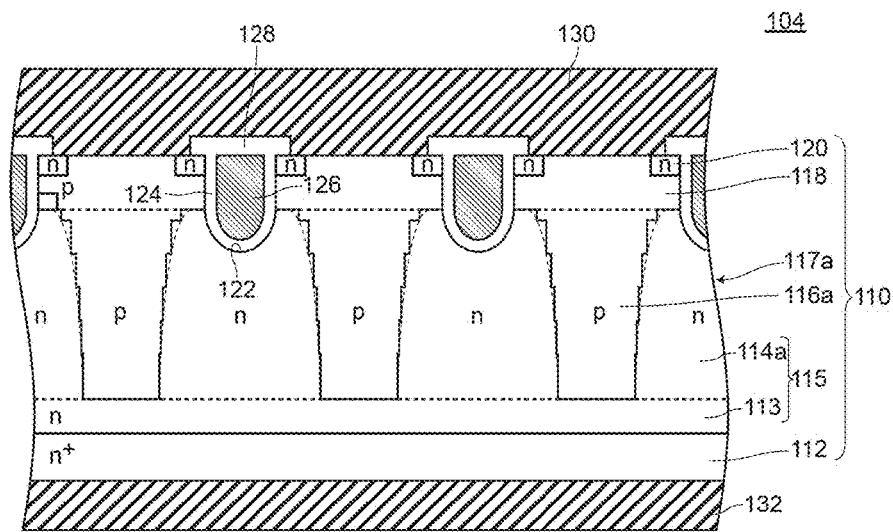
FIG. 15 is a cross-sectional view showing a MOSFET 104 according to Modification 1.
Figure 16:
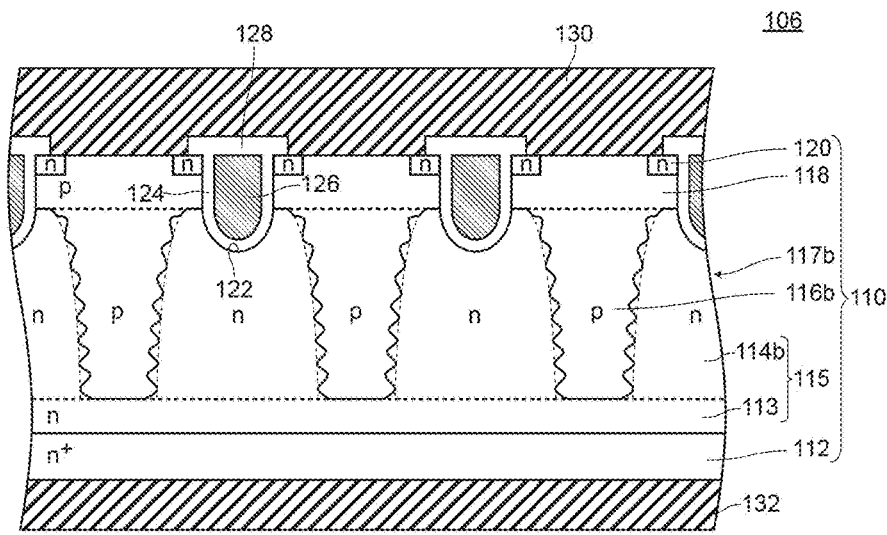
FIG. 16 is a cross-sectional view showing a MOSFET 106 according to Modification 2.
Figure 17:
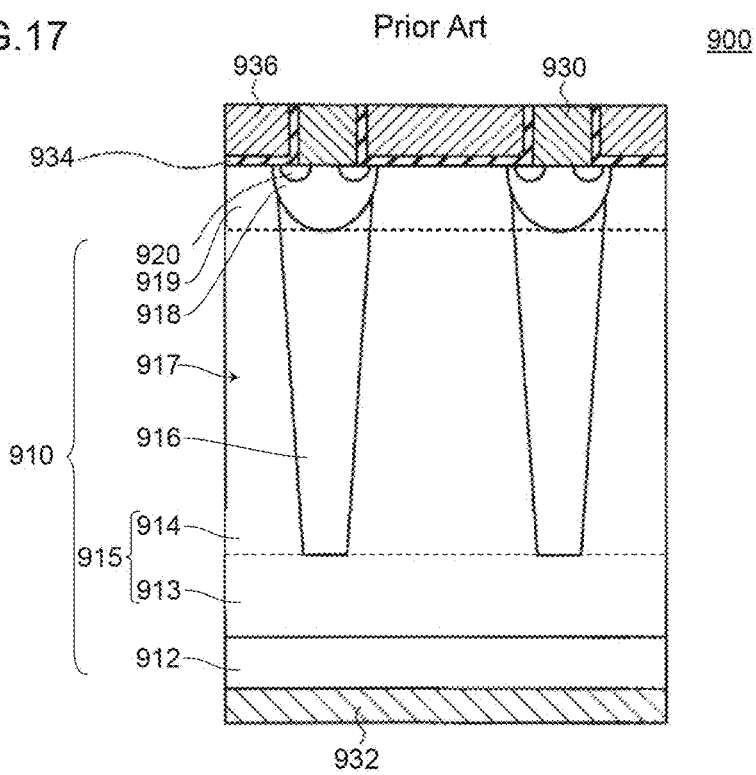
FIG. 17 is a cross-sectional view showing a conventional MOSFET 900. In the drawing, symbol 912 indicates a low-resistance semiconductor layer, symbol 913 indicates a buffer layer, symbol 915 indicates an n-type semiconductor layer, symbol 930 indicates a source electrode, symbol 932 indicates a drain electrode.
Figure 18:
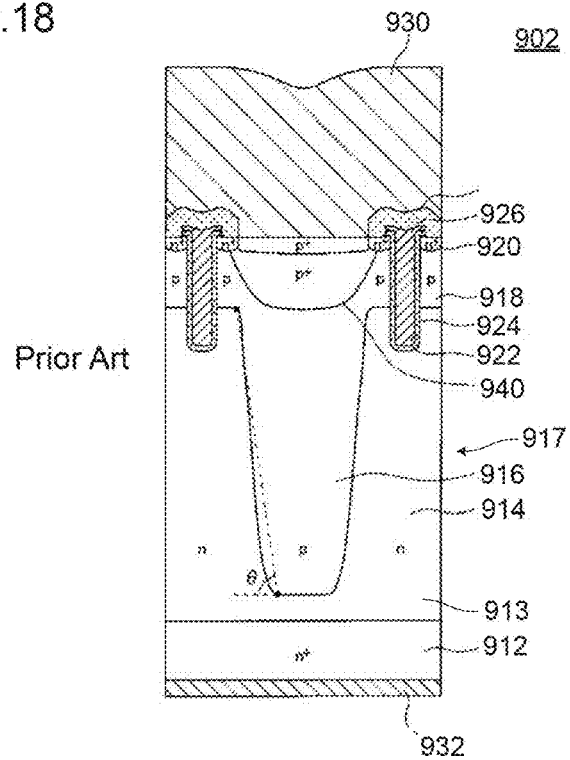
FIG. 18 is a cross-sectional view showing a MOSFET 902 disclosed in patent document 2.

(2) In the above-mentioned embodiments 1 and 3, a width $w_n(x)$ of the n-type column region at a predetermined depth position is expressed by a monotonous upward convex curve projecting in a right upward direction, and a width $w_p(x)$ of the p-type column region at a predetermined depth position is expressed by a monotonous downward convex curve projecting in a right downward direction. However, the present invention is not limited to such a configuration. For example, the width $w_n(x)$ of the n-type column region at a predetermined depth position may be expressed by a stepped shape (a line (envelope) which connects corner portions of steps forming a monotonous upward convex curve projecting in a right upward direction), and the width $w_p$ of the p-type column region at a predetermined depth position may be expressed by a stepped shape (a line (envelope) which connects corner portions of steps forming a monotonous downward convex curve projecting in a right downward direction) (see FIG. 15). Further, the width $w_n(x)$ of the n-type column region at a predetermined depth position may be expressed by a curve where a concave shape and a convex shape are repeated (an envelope made by the concaves and the convexes forming a monotonous upward convex curve projecting in a right upward direction), and the width $w_p$ of the p-type column region at a predetermined depth position may be expressed by a curve where a concave shape and a convex shape are repeated (an envelope made by the concaves and the convexes forming a monotonous downward convex curve projecting in a right downward direction) (see FIG. 16).

(3) In the above-mentioned Embodiment 2, an average density $N_d(x)$ of a positive charge at a predetermined depth position in the n-type column region is expressed by a monotonous upward convex curve projecting in a right upward direction. However, the present invention is not limited to such a case. For example, an average density $N_d(x)$ of a positive charge at a predetermined depth position in the n-type column region may be expressed by a stepped shape (a line which connects corner portions of steps forming a monotonous upward convex curve projecting in a right upward direction) or may be expressed by a curve where a concave shape and a convex are repeated (an envelope made by the concaves and the convexes forming a monotonous upward convex curve projecting in a right upward direction).

(4) In the above-mentioned Embodiment 2, an average density $N_a(x)$ of a negative charge at a predetermined depth position in the p-type column region is expressed by a monotonous downward convex curve projecting in a right downward direction. However, the present invention is not limited to such a case. For example, an average density $N_a(x)$ of a negative charge at a predetermined depth position in the p-type column region may be expressed by a stepped shape (a line which connects corner portions of steps forming a monotonous downward convex curve projecting in a right downward direction) or may be expressed by a curve where a concave shape and a convex are repeated (an envelope made by the concaves and the convexes forming a monotonous downward convex curve projecting in a right downward direction).

(5) In the above-mentioned respective Embodiments, the n-type column region 114, the p-type column region 116, the trench 122 and the gate electrode 126 are formed in a stripe shape as viewed in a plan view. However, the present invention is not limited to such a structure. The n-type column region 114, the p-type column region 116, the trench 122 and the gate electrode 126 may be formed in a circular shape (a columnar shape as viewed stereoscopically), a quadrangular frame shape, a circular frame shape or a grid shape as viewed in a plan view.

(6) In the above-mentioned respective Embodiments, a DC power source is used as the power source. However, the present invention is not limited to such a structure. An AC power source may be used as the power source.

(7) A chopper circuit is used as the power conversion circuit in the above-mentioned Embodiments 1 to 3, while a full bridge circuit is used as the power conversion circuit in the above-mentioned Embodiment 4. However, the present invention is not limited to such a structure. As the power conversion circuit, a half bridge circuit, a three-phase AC converter, a non-insulating-type full bridge circuit, a non-insulating-type half bridge circuit, a push-pull circuit, an RCC circuit, a forward converter, a flyback converter or other circuits may be used.

(8) A PIN diode is used as the rectifier element in the above-mentioned Embodiments 1 to 3, while a built-in diode of the MOSFET is used as the rectifier element in Embodiment 4. However, the present invention is not limited to such a structure. As the rectifier element, a fast recovery diode such as a JBS or an MPS, silicon-carbide Schottky barrier diodes or other diodes may be used.

(9) In the above-mentioned Embodiment 4, as the rectifier element, only a built-in diode of the MOSFET is used. However, the present invention is not limited to such a structure. When a recovery loss of a built-in diode is excessively large, an additional rectifier element may be connected in parallel with the MOSFET.

The invention claimed is:

1. A MOSFET comprising: a semiconductor base substrate having the super junction structure which is formed of an n-type column region and a p-type column region; and a gate electrode formed on a first main surface side of the semiconductor base substrate by way of a gate insulation film, wherein using a deepest position of a surface of a depletion layer on the first main surface side when the depletion layer extends most in the super junction structure by turning off the MOSFET as a reference, in a graph where a depth x at a predetermined depth position in the super junction structure when the super junction structure is depleted by turning off the MOSFET is taken on an axis of abscissas, and an average positive charge density p(x) at the predetermined depth position in the super junction structure expressed by a following formula (1) when the super junction structure is depleted by turning off the MOSFET is taken on an axis of ordinates, the average positive charge density p(x) is expressed by an upward convex curve projecting in a right upward direction, and using a deepest position of a surface of a depletion layer on the first main surface side when the depletion layer extends most in the super junction structure by turning off the MOSFET as a reference, assuming a depth of a surface of the depletion layer on a second main surface side at a shallowest position when the depletion layer extends most in the super junction structure by turning off the MOSFET as a, a value of the average positive charge density p(0) when x=0 becomes a negative value and a value of the average positive charge density p(a) when x=a becomes a positive value, and an area of a region surrounded by a curve which expresses the average positive charge density p(x), a straight line where x=0 and the axis of abscissas is equal to an area of a region surrounded by the curve which expresses the average positive charge density p(x), a straight line where x=a and the axis of abscissas;

[Formula 1]

$$P(x)=q/2w[Wn(x){\cdot}Nd(x)-wp(x){\cdot}Na(x)] \quad (1)$$

(In the formula (1), wn (x) indicates a width of the n-type column region at the predetermined depth position, Nd(x) indicates average density of a positive charge at the predetermined depth position in the n-type column region when the super junction structure is depleted by turning off the MOSFET, wp(x) indicates a width of the p-type column region at the predetermined depth position, Na(x) indicates average density of a negative charge at the predetermined depth position in the p-type column region when the super junction structure is depleted by turning off the MOSFET, q indicates an elementary charge, and w indicates a positive constant which satisfies wn(x)+wp(x)=2w).

2. The MOSFET according to claim 1, wherein using a deepest position of a surface of a depletion layer on the first main surface side when the depletion layer extends most in the super junction structure by turning off the MOSFET as a reference, assuming a depth of a surface of the depletion layer on the second main surface side at a shallowest position when the depletion layer extends most in the super junction structure by turning off the MOSFET as a, and a depth of a depth position where the average positive charge density ρ(x) becomes 0 in the super junction structure as d, a relationship of 0<d<a/2 is satisfied.

3. The MOSFET according to claim 1, wherein in a graph where the depth x at the predetermined depth position in the super junction structure is taken on an axis of abscissas, and a width $w_n(x)$ at the predetermined depth position in the n-type column region or a width $w_p(x)$ at the predetermined depth position in the p-type column region is taken on an axis of ordinates, the width $w_n(x)$ at the predetermined depth position in the n-type column region is expressed by an upward convex curve projecting in a right upward direction, and the width $w_p(x)$ at the predetermined depth position in the p-type column region is expressed by a downward convex curve projecting in a right downward direction.

4. The MOSFET according to claim 1, wherein in a graph where the depth x at the predetermined depth position in the super junction structure is taken on an axis of abscissas, and average density $N_d(x)$ of a positive charge at the predetermined depth position in the n-type column region or average density $N_a(x)$ of a negative charge at the predetermined depth position in the p-type column region when the super junction structure is depleted by turning off the MOSFET is taken on an axis of ordinates, average density $N_d(x)$ of a positive charge at the predetermined depth position in the n-type column region when the super junction structure is depleted by turning off the MOSFET is expressed by an upward convex curve projecting in a right upward direction, and average density $N_a(x)$ of a negative charge at the predetermined depth position in the p-type column region when the super junction structure is depleted by turning off the MOSFET is expressed by a downward convex curve projecting in a right downward direction.

5. The MOSFET according to claim 1, wherein the semiconductor base substrate further has a p-type base region formed on a surface of the n-type column region and a surface of the p-type column region, and an n-type source region formed on a surface of the base region, the MOSFET further includes, in a region where the n-type column region is positioned as viewed in a plan view, a trench formed so as to extend from a surface of a first main surface of the semiconductor base substrate to a depth position deeper than a deepest portion of the base region and a portion of the source region is exposed on an inner peripheral surface of the trench, the gate insulation film is formed on the inner peripheral surface of the trench, and the gate electrode is embedded in the trench by way of the gate insulation film.

6. The MOSFET according to claim 5, wherein using a deepest position of a surface of a depletion layer on the first main surface side when the depletion layer extends most in the super junction structure by turning off the MOSFET as a reference, in a graph where an axis along a depth direction is set as an x axis, an x coordinate at a depth position of a lowermost surface of the base region is set as −t, an x coordinate at depth position of a lowermost portion of the p-type column region is set as b, and an x coordinate at a depth position where the average positive charge density ρ(x) becomes 0 is set as d, a relationship of 0<t+d<(t+b)/2 is satisfied.

7. The MOSFET according to claim 1, wherein the semiconductor base substrate further has: a base region formed on a surface of the first main surface of the semiconductor base substrate, a whole surface of the p-type column region, and a portion of a surface of the n-type column region; an n-type surface high concentration region formed on a surface of the first main surface of the semiconductor base substrate and a surface of the n-type column region such that the n-type surface high concentration region is formed adjacently to the base region; and an n-type source region formed on a surface of the base region, and the gate electrode is formed on a surface of the base region sandwiched between the source region and the n-type surface high concentration region by way of the gate insulation film.

8. A power conversion circuit comprising at least:
a reactor;
a power source which supplies an electric current to the reactor;
the MOSFET according to claim 1 for controlling an electric current supplied from the power source to the reactor; and
a rectifier element which performs a rectifying operation of the electric current supplied from the power source to the reactor or an electric current from the reactor.

9. The power conversion circuit according to claim 8, wherein the rectifier element is a fast recovery diode.

10. The power conversion circuit according to claim 8, wherein the rectifier element is a built-in diode of the MOSFET.

11. The power conversion circuit according to claim 8, wherein the rectifier element is a silicon-carbide Schottky barrier diode.

* * * * *